(12) United States Patent
Arbogast et al.

(10) Patent No.: US 6,933,662 B2
(45) Date of Patent: Aug. 23, 2005

(54) ELECTROSTRICTIVE COMPOUND ACTUATOR

(75) Inventors: Darin J. Arbogast, Maple Valley, WA (US); Frederick T. Calkins, Renton, WA (US); Dan J. Clingman, Auburn, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/376,907

(22) Filed: Feb. 27, 2003

(65) Prior Publication Data

US 2004/0084986 A1 May 6, 2004

Related U.S. Application Data

(63) Continuation-in-part of application No. 10/286,097, filed on Oct. 31, 2002.

(51) Int. Cl.[7] .................................... H01L 41/047
(52) U.S. Cl. .................. 310/366; 310/330; 310/331
(58) Field of Search ............................ 310/317, 320, 310/330–332, 366

(56) References Cited

U.S. PATENT DOCUMENTS 2,242,756 A * 5/1941 Pope ..................... 381/190
5,552,658 A * 9/1996 Dibbern et al. ........... 310/366
6,297,579 B1 * 10/2001 Martin et al. ............. 310/330
6,429,574 B1 * 8/2002 Mohr et al. .............. 310/334

FOREIGN PATENT DOCUMENTS

| JP | 1-234064 | * | 9/1989 | ............ 310/330 |
| JP | 6-232469 | * | 8/1994 | ............ 310/317 |

* cited by examiner

*Primary Examiner*—Thomas M. Dougherty
(74) *Attorney, Agent, or Firm*—Black Lowe & Graham, PLLC

(57) ABSTRACT

The present invention presents a system for a compound actuator. The system includes first and second electrode layers each including two electrode sections, an intermediate electrode layer between the first and second electrode layers, and first and second electrostrictive materials that change length in an applied electrical field. The first electrostrictive material is positioned between the first and intermediate electrode layers. The second electrostrictive material is positioned between the intermediate and second electrode layers. The first electrostrictive material has a first length adjoining the first electrode section and a second length adjoining the second electrode section. The second electrostrictive material has a third length adjoining the fourth electrode section and a fourth length adjoining the fifth electrode section. The first and second electrostrictive materials are attached such that differential changes in the first and third lengths, and the second and fourth lengths, respectively, results in a compound lateral motion.

16 Claims, 15 Drawing Sheets

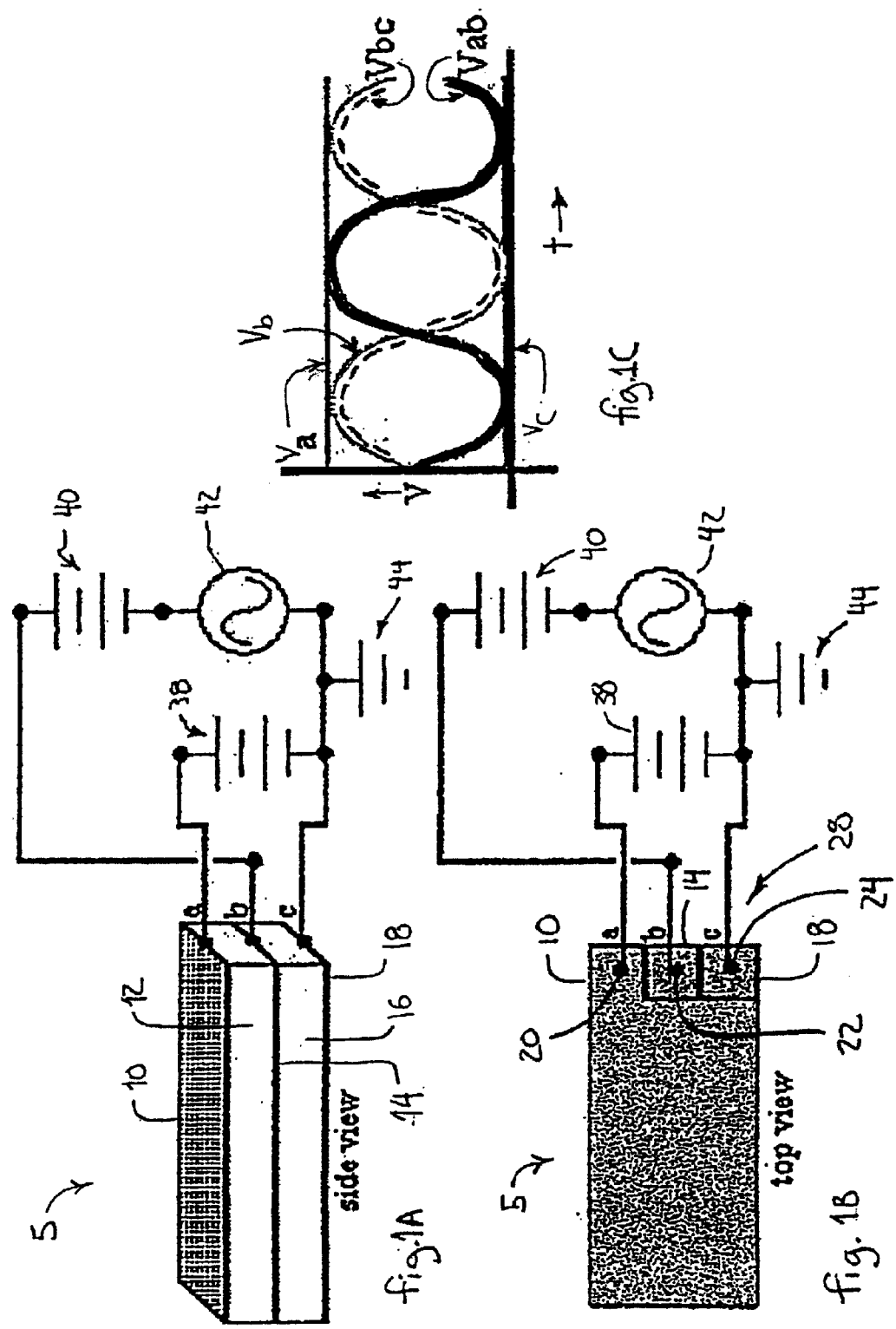

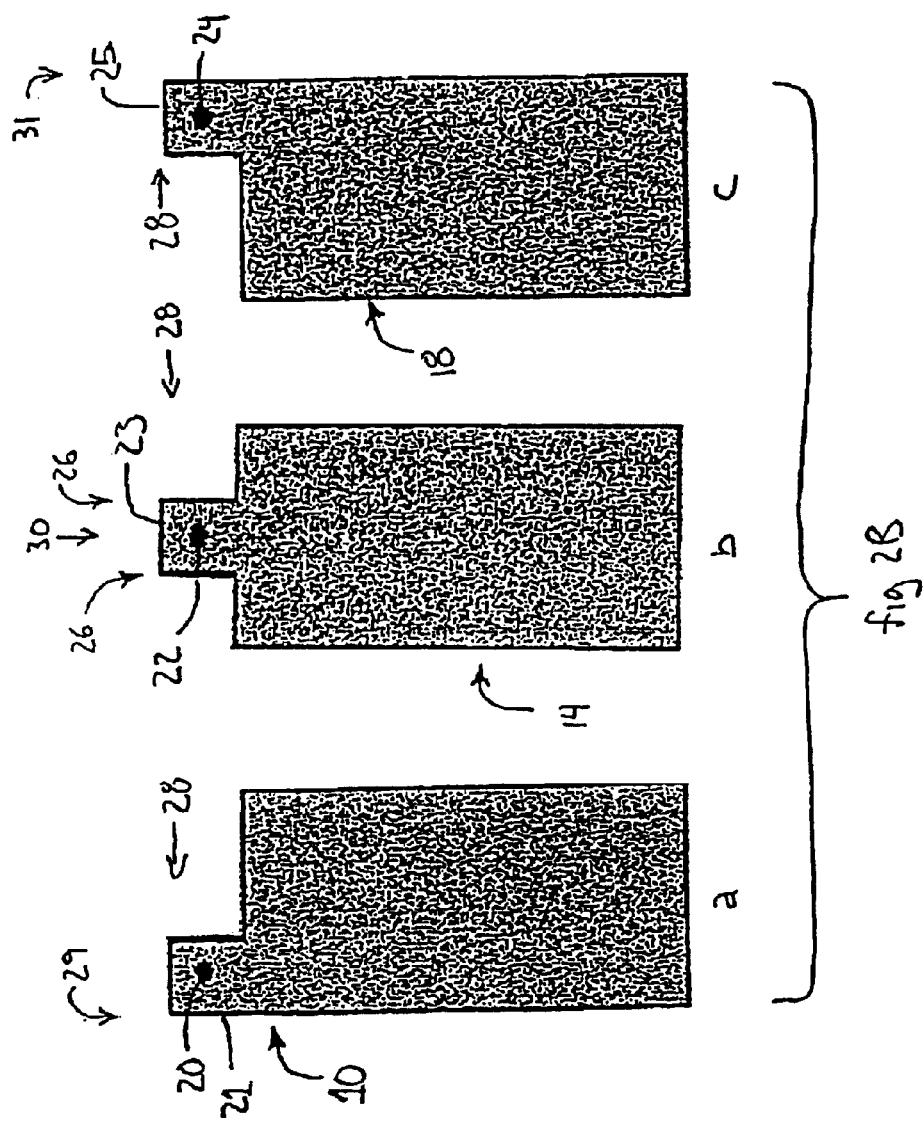
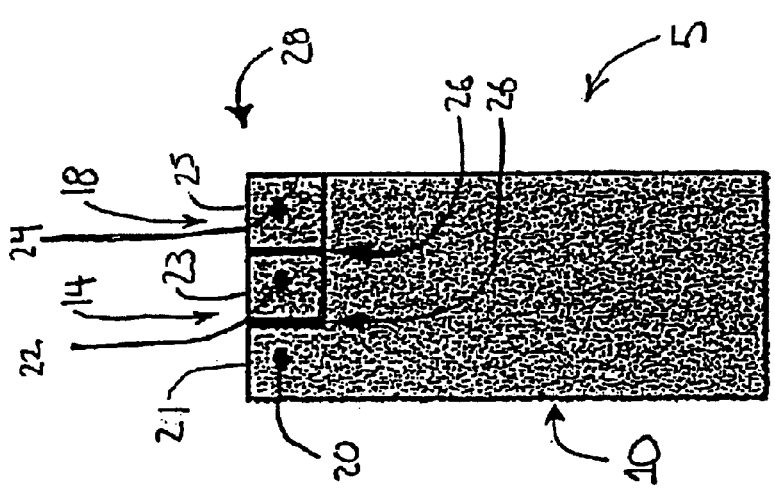

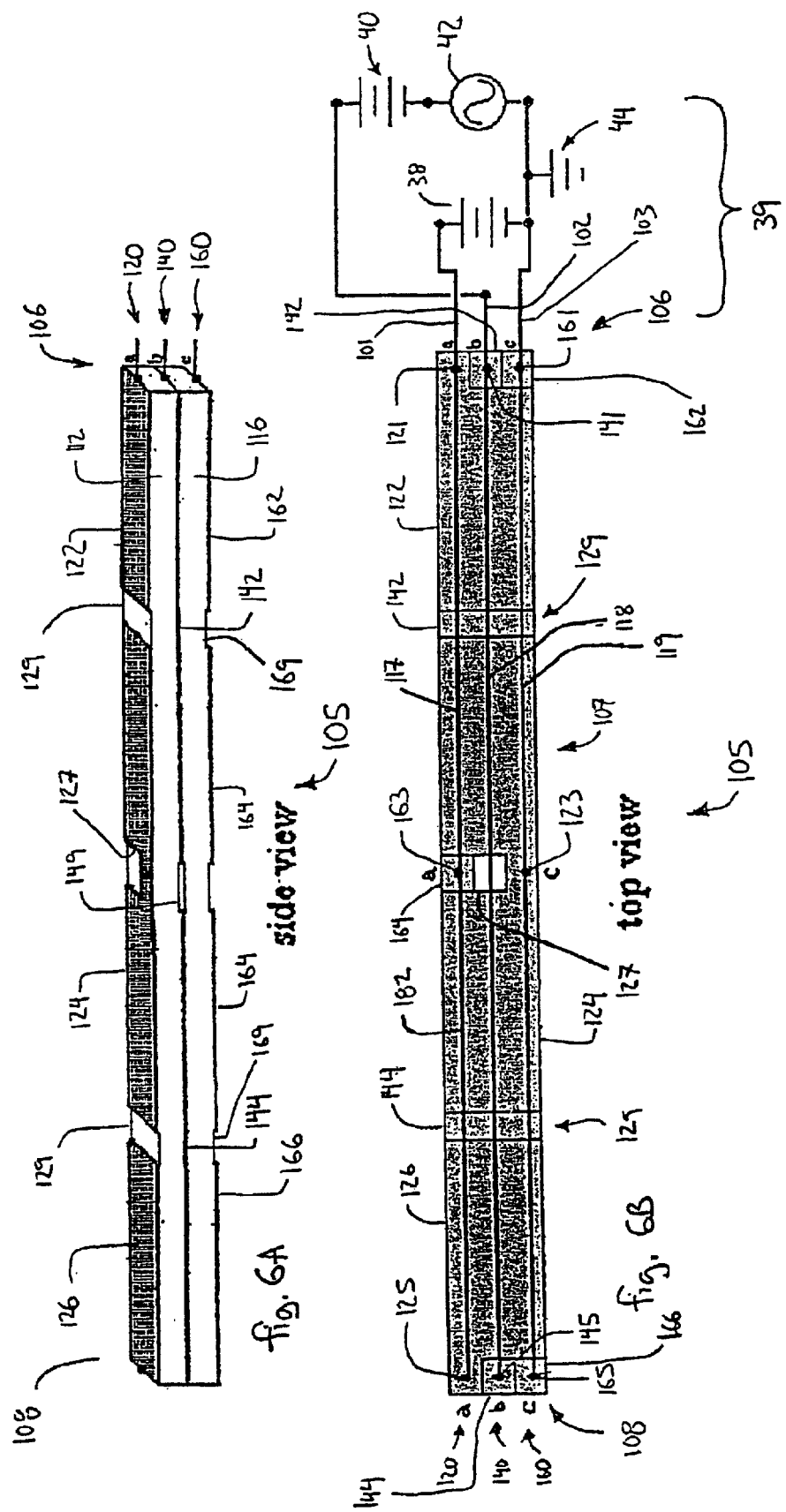

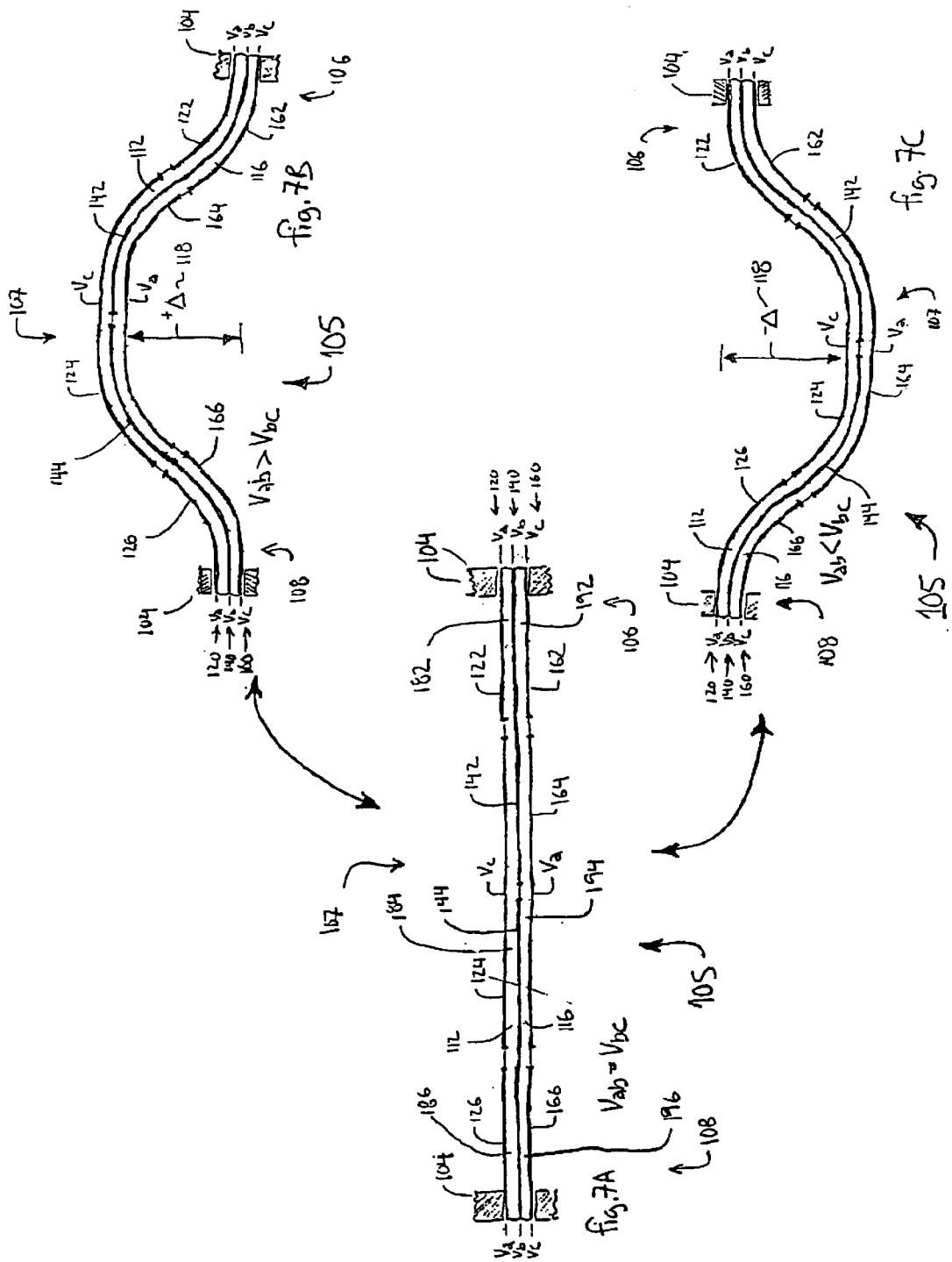

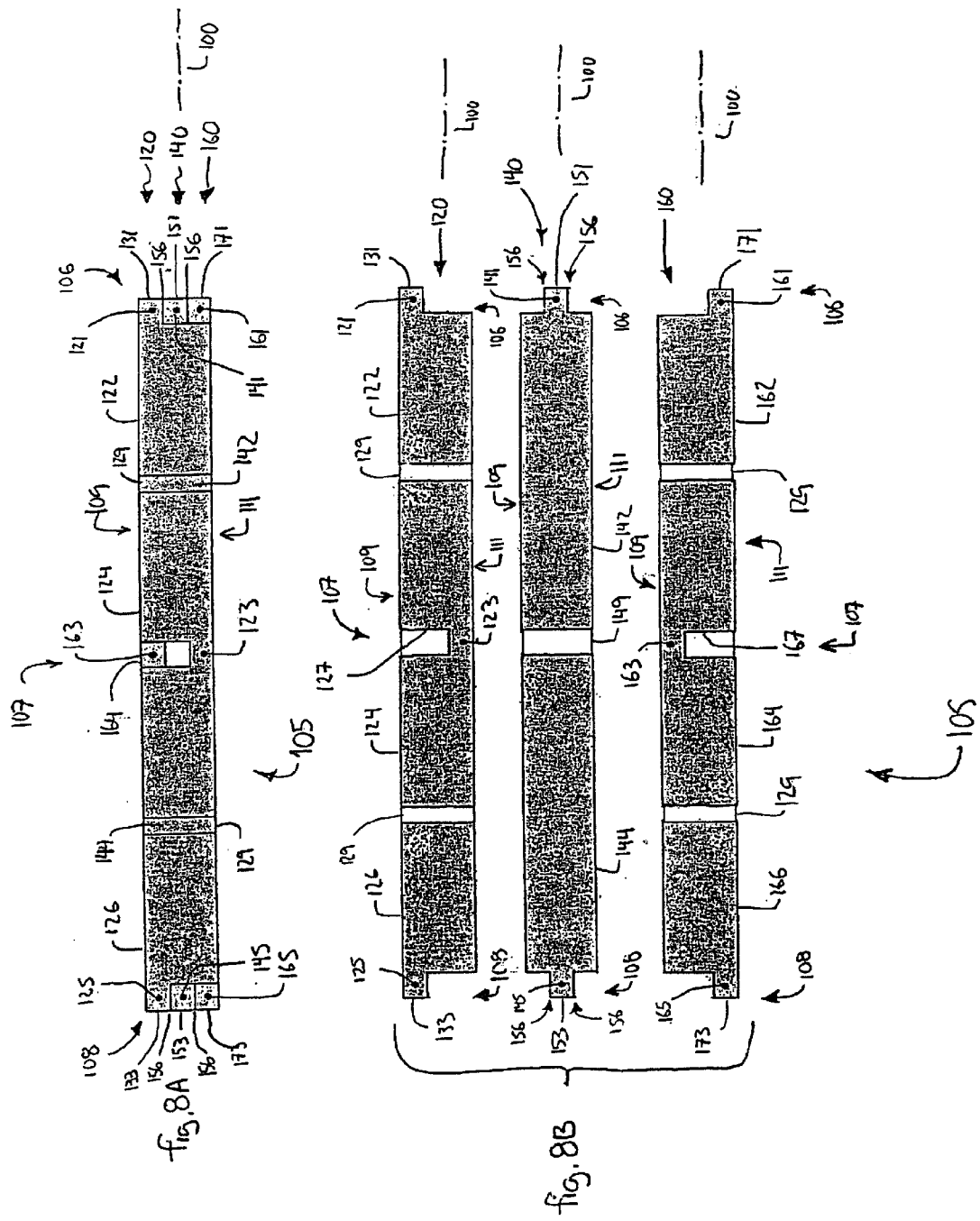

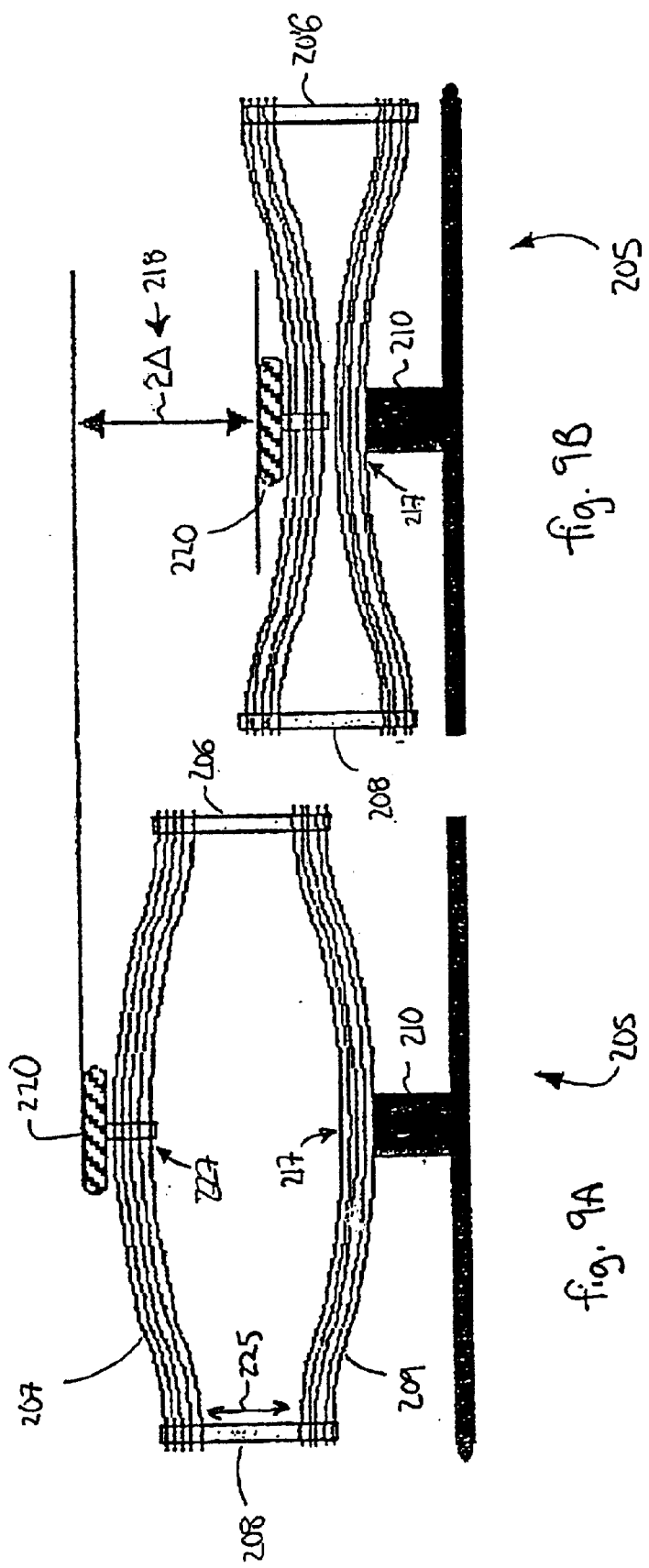

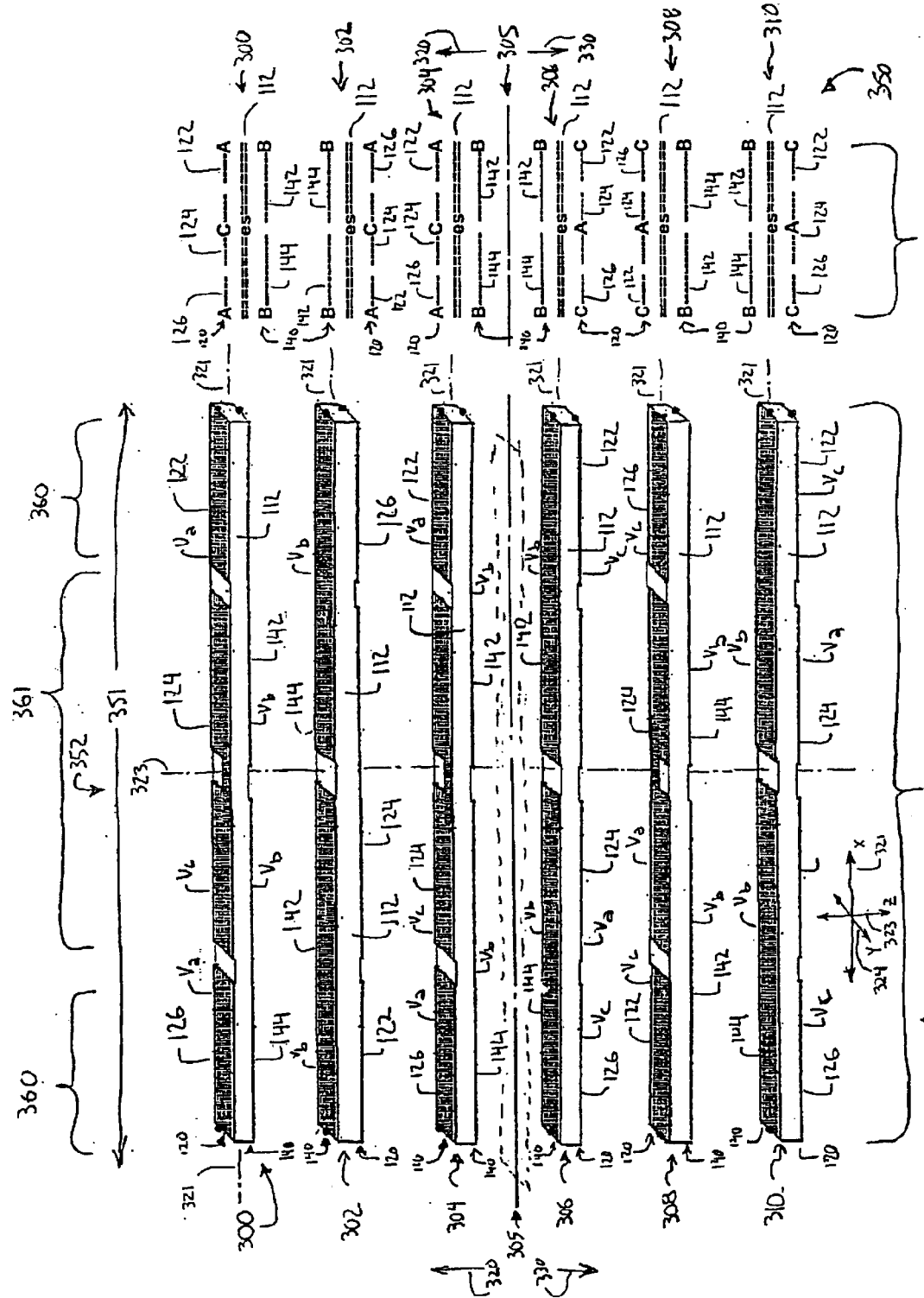

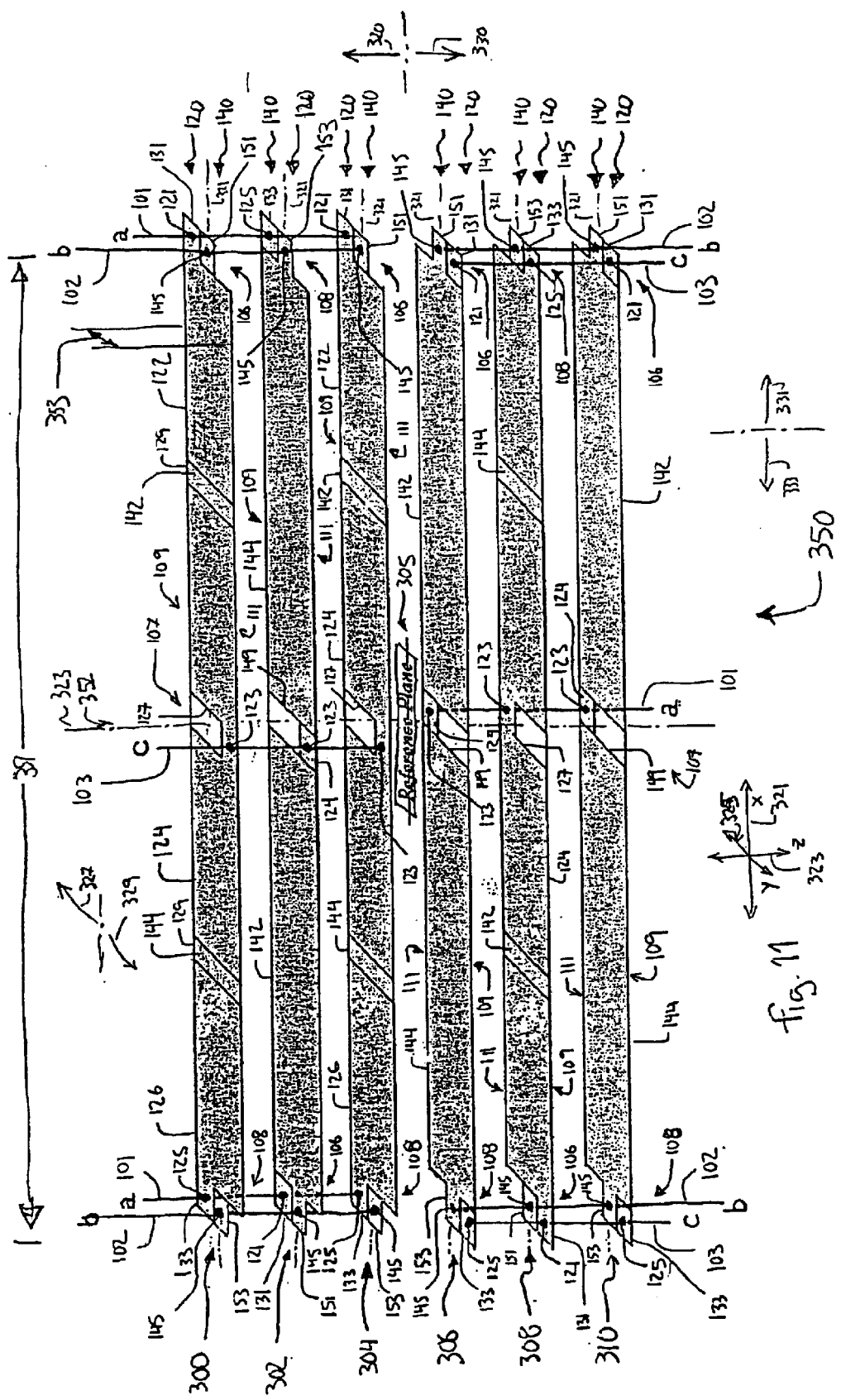

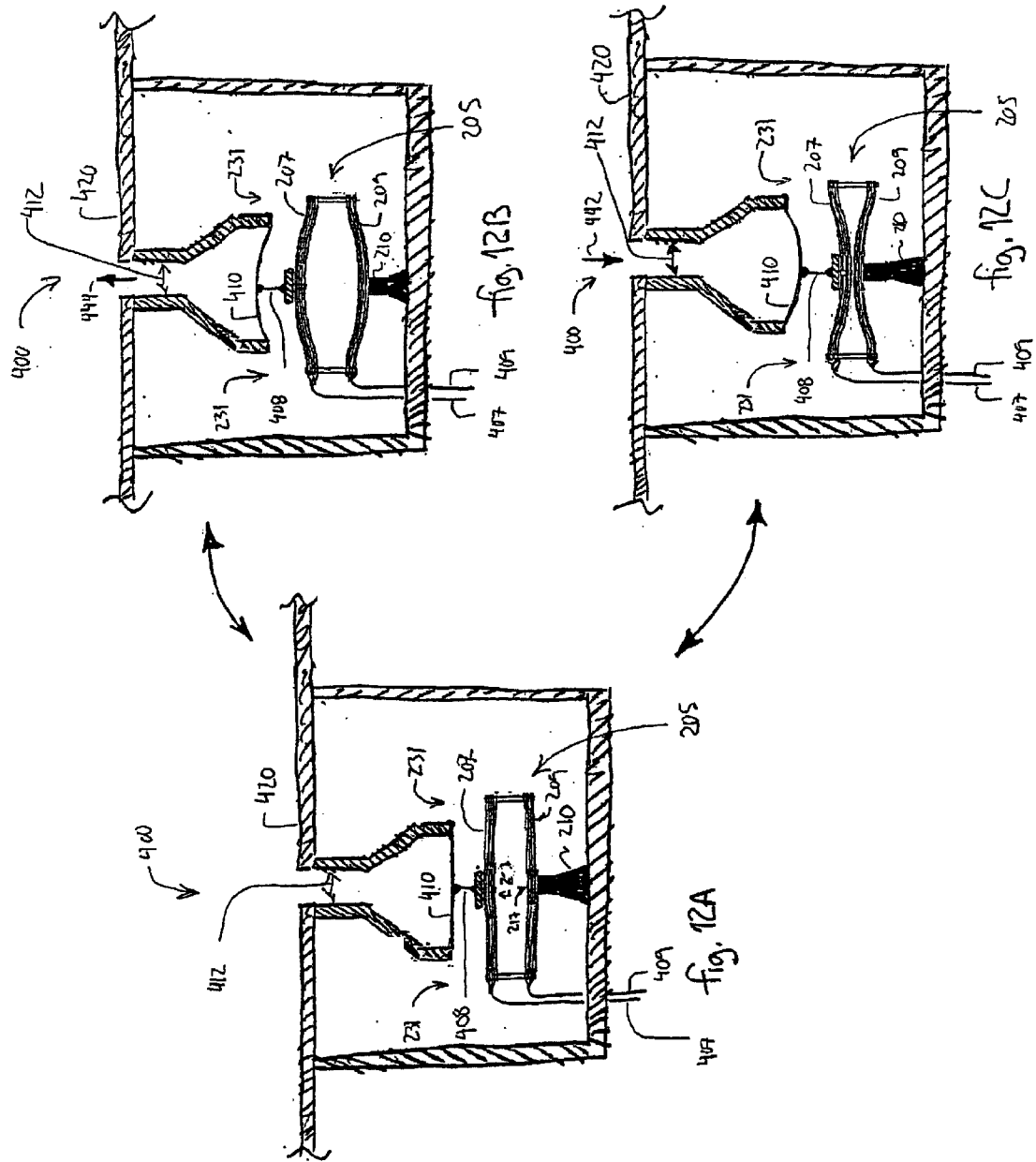

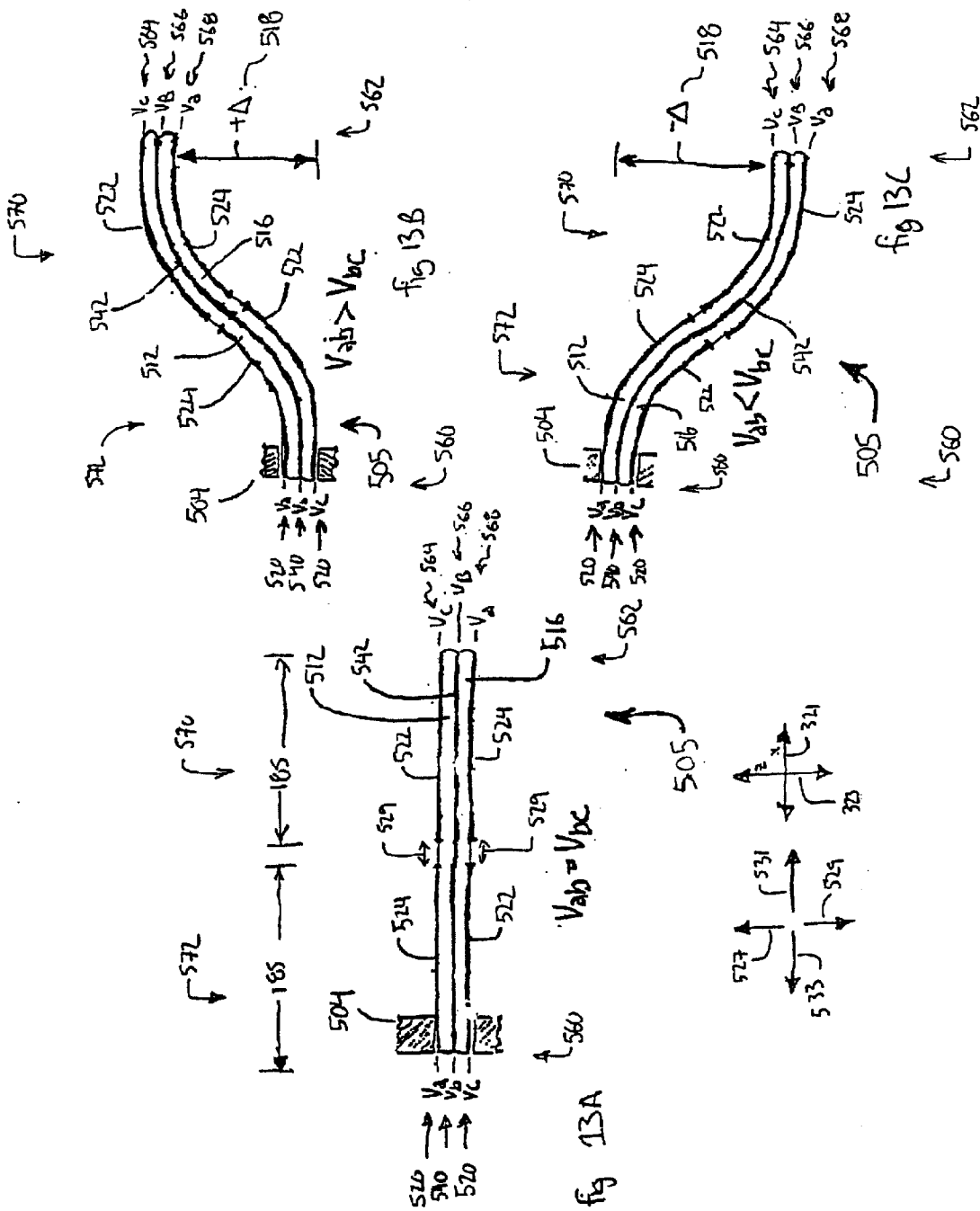

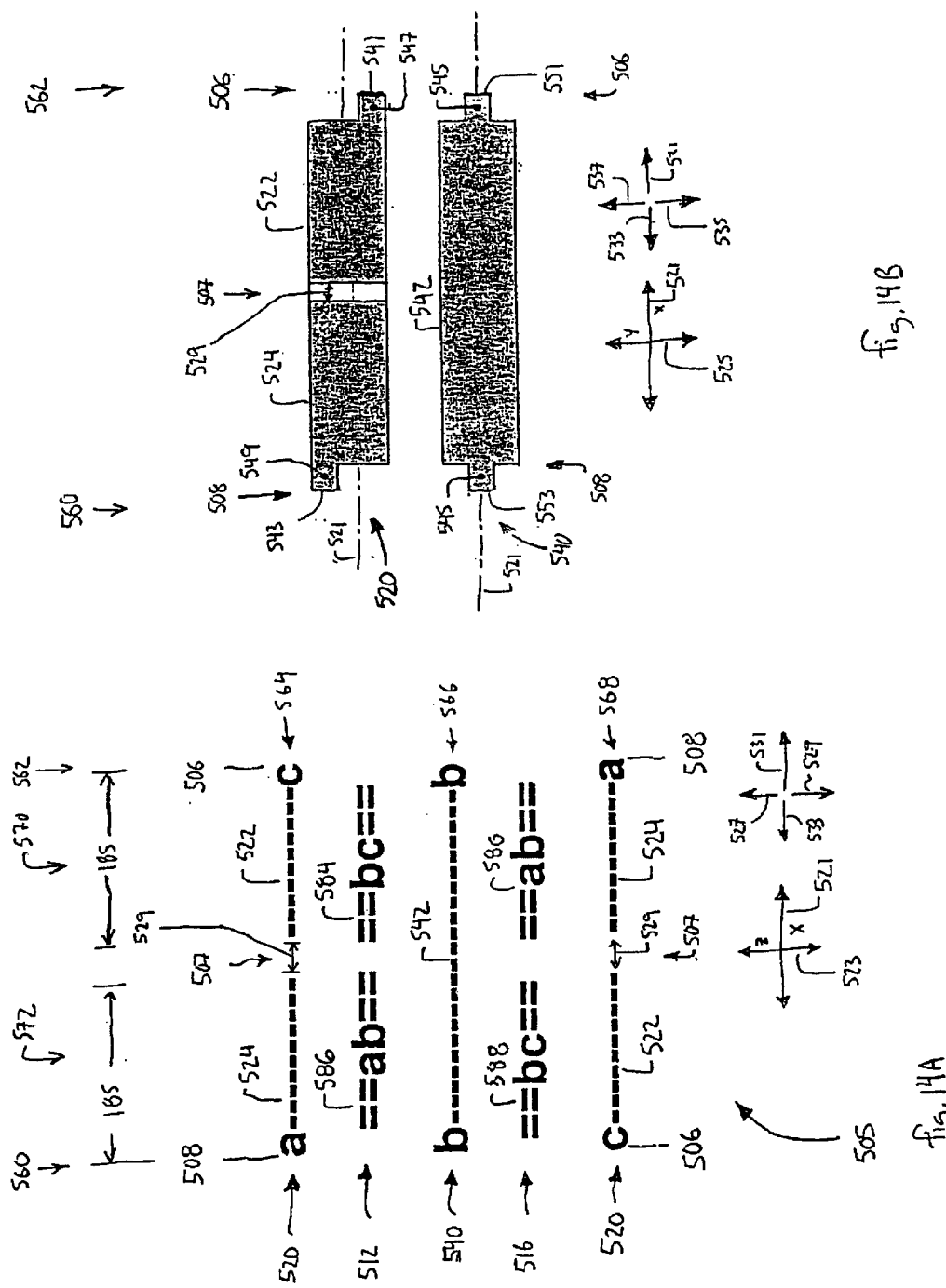

ELECTROSTRICTIVE COMPOUND ACTUATOR

RELATED APPLICATION

This application is a continuation-in-part of the patent application Ser. No. 10/286,097 filed on Oct. 31, 2002, and entitled "Electrical System for Electrostrictive Bimorph Actuator."

GOVERNMENT LICENSE RIGHTS

This invention was made with Government support under U.S. Government contract awarded by the Department of the Army, DADD-19-99-C-0023. The Government has certain rights in this invention.

FIELD OF THE INVENTION

This invention relates generally to electrostrictive materials and, more specifically, to actuators based upon electrostrictive materials.

BACKGROUND OF THE INVENTION

Piezoelectric materials exhibit strain when subject to an applied electrical field. For example, piezoelectric materials exhibit both elongation and contraction when subject to varying electrical fields. As a result, piezoelectric materials have been used in actuator applications where their linear relationship of strain to the applied field is exploited to create both elongation and contraction, thereby creating a bi-directional actuator.

Recent advances in the fields of piezoelectric and ferroelectric research have lead to the discovery of new materials exhibiting even larger but electrostrictive or contractive strain. In particular, electrostrictive crystals such as Lead Magnesium Niobate-Lead Titanate [PMN-PT], Lead Zinc Niobate-Lead Titanate [PZN-PT], and electron-irradiated copolymer poly (vinylidene fluoride-trifluoroethyline) [P(VDF-TrFE)], exhibit large energy densities and recoverable strains of 1% to 4%. In general, the higher strain capacity and energy density of electrostrictive materials (as compared to piezoelectric materials) make them attractive replacements for piezoelectrics in actuators. For example, the strain coefficient for the piezoelectric polyvinylidene fluoridine is less than 10% of the strain coefficient for the electrostrictive irradiated P(VDF-TrFE).

However, electrostrictive materials only exhibit unidirectional strain even when polarity of the applied electrical field is reversed. Due to this feature, only unimorph or one-directional electrostrictive actuators have been created. Unimorph electrostrictive actuators typically include a passive restoring layer. This passive layer reduces the active portion of the actuator, and thus decreases the total energy density of the actuator. If the entire actuator could be active, an electrostrictive bimorph or bi-directional actuator could theoretically exceed the performance of a similar piezoelectric bimorph actuator by a factor of at least 5. However, a fully active bimorph electrostrictive actuator would have to compensate for the material having only unidirectional strain.

Therefore, there is an unmet need for bimorph or bi-directional actuators using electrostrictive materials.

SUMMARY OF THE INVENTION

The present invention provides bimorph actuation of systems utilizing high-density electrostrictive materials, thereby permitting the size and weight of electrically driven actuators and arrays of actuators to be reduced.

The present invention presents a system for a compound actuator. The system includes first and second electrode layers each including two electrode sections, an intermediate electrode layer between the first and second electrode layers, and first and second electrostrictive materials that change length in an applied electrical field. The first electrostrictive material is positioned between the first and intermediate electrode layers. The second electrostrictive material is positioned between the intermediate and second electrode layers. The first electrostrictive material has a first length adjoining the first electrode section and a second length adjoining the second electrode section. The second electrostrictive material has a third length adjoining the fourth electrode section and a fourth length adjoining the fifth electrode section. The first and second electrostrictive materials are attached such that differential changes in the first and third lengths, and the second and fourth lengths, respectively, results in a compound lateral motion.

According to other aspects, the present invention provides a system of electrodes for a compound actuator, a recurve actuator, a multi-layer actuator, an actuator array, and methods for actuating compound actuators and arrays. The present invention may be utilized to generate a synthetic jet for aeronautical or other purposes.

BRIEF DESCRIPTION OF THE DRAWINGS

The preferred and alternative embodiments of the present invention are described in detail below with reference to the following drawings.

FIG. 1A is a side perspective view of the bimorph actuator connected to an exemplary drive circuit;

FIG. 1B is a top view of the bimorph actuator connected to an exemplary drive circuit;

FIG. 1C is a plot of voltage versus time for the bimorph actuator;

FIG. 2A is a top view of the first, second, and third electrodes in assembled configuration;

FIG. 2B is a top view of the individual first, second and third electrodes;

FIG. 6A is a side perspective view of a recurve actuator;

FIG. 6B is a top view of a recurve actuator connected to an exemplary drive circuit;

FIG. 7A is a side view of a recurve actuator of the present invention;

FIG. 7B is a side view of a recurve actuator of the present invention showing bending;

FIG. 7C is a side view of a recurve actuator of the present invention showing opposite bending;

FIG. 8A is a top view of the first, second, and third electrode sheets of a recurve actuator in assembled configuration;

FIG. 8B are top views of the individual first, second, and third electrode sheets of a recurve actuator;

FIG. 9A is a side view of a recurve actuator array of the present invention in expanded configuration;

FIG. 9B is a side view of a recurve actuator array of the present invention in contracted configuration;

FIG. 10A is an exploded perspective side view of a multi-layer recurve actuator of the present invention;

FIG. 10B is a symbolic side view of the electrode configuration of a multi-layer recurve actuator;

FIG. 11 is an perspective side view of the electrode sheets and electrical connections for a multi-layer recurve actuator;

FIG. 12A is a cross-section of a synthetic jet driven by a recurve actuator array of the present invention in its neutral configuration;

FIG. 12B is a cross-section of a synthetic jet driven by a recurve actuator array in its extended configuration;

FIG. 12C is a cross-section of a synthetic jet driven by a recurve actuator array in its retracted configuration;

FIG. 13A is a side view of a compound actuator of the present invention;

FIG. 13B is a side view of a compound actuator showing bending;

FIG. 13C is a side view of a compound actuator showing opposite bending;

FIG. 14A is a symbolic side view of the electrode configuration of a compound actuator of the present invention; and FIG. 14B is a top view of the individual electrode sheets of a compound actuator of the present invention.

DETAILED DESCRIPTION OF THE INVENTION

Figure 3:
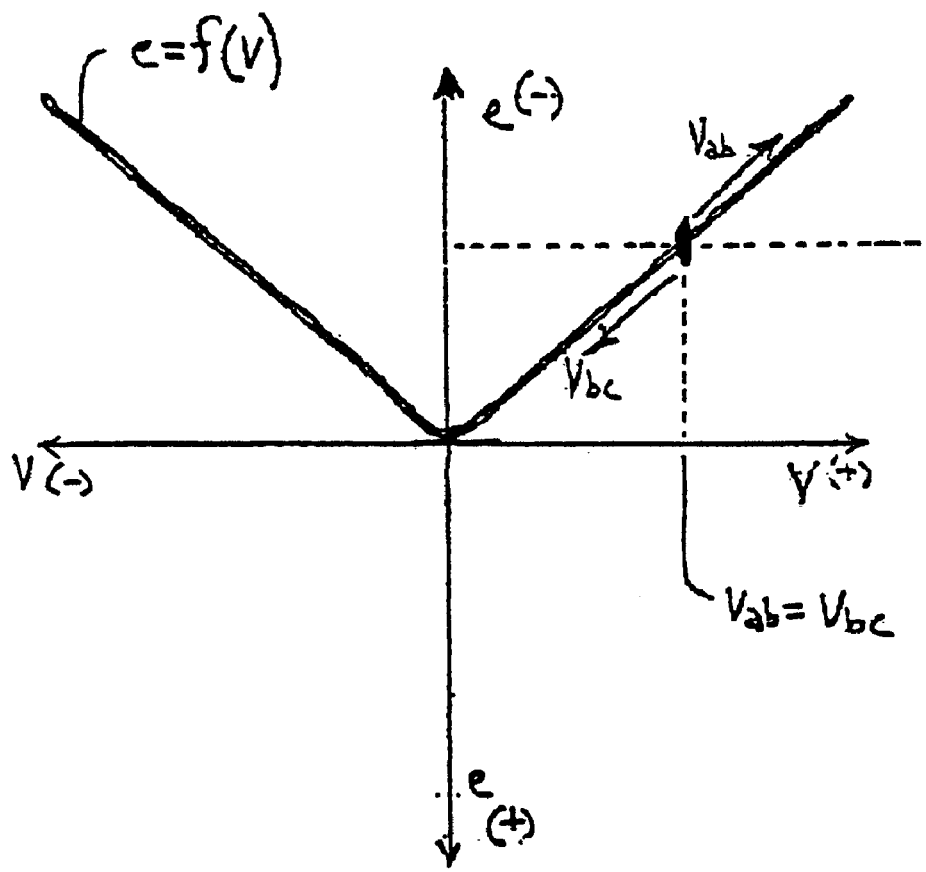
FIG. 3 is a plot of voltage versus strain showing strain derived from the applied voltages.

By way of overview, the present invention presents a system for a compound actuator. The system includes first and second electrode layers each including two electrode sections, an intermediate electrode layer between the first and second electrode layers, and first and second electrostrictive materials that change length in an applied electrical field. The first electrostrictive material is positioned between the first and intermediate electrode layers. The second electrostrictive material is positioned between the intermediate and second electrode layers. The first electrostrictive material has a first length adjoining the first electrode section and a second length adjoining the second electrode section of the first electrode layer. The second electrostrictive material has a third length adjoining the fourth electrode section and a fourth length adjoining the fifth electrode section of the second electrode layer. The first and second electrostrictive materials are attached such that differential changes in the first and third lengths, and the second and fourth lengths, respectively, results in a compound lateral motion.

Other embodiments of the present invention provide a system of electrodes for a compound actuator, a recurve actuator, a multi-layer actuator, an actuator array, and methods for actuating compound actuators and arrays. The present invention may be utilized to generate a synthetic jet for aeronautical or other purposes.

As a result, the present invention advantageously provides bimorph actuation of systems utilizing high-density electrostrictive materials, thereby permitting the size and weight of electrically driven actuators and sensors to be reduced.

FIG. 1A is a perspective side view of a system 5 of an exemplary bimorph actuator of the present invention connected to an exemplary drive circuit. An electrode 14 is sandwiched between a layer 12 of electrostrictive material and a layer 16 of electrostrictive material. A second electrode 10 is arranged against the layer 12, sandwiching the layer 12 between the electrode 14 and electrode 10. A third electrode 18 is arranged against the layer 16 to sandwich the electrostrictive layer 16 between the electrode 14 and electrode 18. Layer 12 and the layer 16 are suitably electrostrictive materials that contract when subjected to an electrical field.

Suitable electrostrictive materials include electrostrictive crystals such as Lead Magnesium Niobate-Lead Titanate [PMT-PT], Lead Zinc Niobate-Lead Titanate [PZN-PT], and electron irradiated copolymer poly(vinylidene fluoride-trifluoroethyline) [P(VDF-TrFE)]. Other electrostrictive materials include grafted elastomers, ceramic electrostrictors, other relaxor ferroelectric-ferroelectric solid-state solutions, ionic polymers; and PVDF terpolymers. In one presently preferred embodiment, the layer 12 and the layer 16 are sheets of irradiated P(VDF-TrFE). Relaxor ferroelectric-ferroelectric solid-state solutions are a family of electrostrictive crystals including PZN-PT and PMT-PT as well as other complex perovskite crystal analogs. It will be appreciated that the electrostrictive materials act as dielectrics, and do not conduct appreciable current.

The electrodes 10, 14, and 18 may be any suitable electrical conductor including without limitation gold, copper, or aluminum. The electrodes 10, 14, and 18 may be sheet conductors, or may be conductors that are sputtered or chemically vapor-deposited on the electrostrictive material. In one presently preferred embodiment, the electrodes 10, 14, and 18 each include sheets of electrically conductive material, such as copper or the like.

The electrode 10, layer 12, electrode 14, layer 16, and electrode 18 may be assembled by any suitable method that links the layer 12 to the layer 16 such that differential changes in length between the layer 12 and the layer 16 cause the bimorph actuator system 5 to move laterally by bending. In one exemplary embodiment, the electrode 10 is fastened to the layer 12, the layer 12 is fastened to the electrode 14, the electrode 14 is fastened to the layer 16, and the layer 16 is fastened to the electrode 18 suitably using thin-film adhesive. Any suitable method of fastening may be utilized, including without limitation thin-film adhesive, double-stick films, RBC epoxy, or applied adhesive. In one embodiment, an acceptable adhesive includes Spurr Epoxy manufactured by Poly Sciences, Inc. In another exemplary embodiment, the thin-film adhesive is a double-stick acrylic film with adhesive on both sides. Any suitable attachment, including mechanical attachments or fasteners, such as non-conducting rivets or pins, may be suitably used to connect the layer 12 to the layer 16 so that differential changes in the respective lengths of the layer 12 and the layer 16 cause the system 5 to move laterally by bending. For example, if one end of the system 5 is restrained, bending causes lateral motion of the unrestrained end. If both ends of the system 5 are restrained from moving laterally, the middle section will move laterally as the system 5 bends. This lateral motion or bending suitably may be used to drive mechanical systems.

The electrode 10 and the electrode 18 are connected to a voltage source 38. The voltage source 38 generates an electrical field between the electrode 10 and the electrode 18. In an exemplary embodiment, the voltage source 38 is a DC voltage source that induces a constant electrical field through the layer 12 and the layer 16, suitably shortening the layer 12 and the layer 16.

The electrode 14 is also connected to a voltage source, such as a bias voltage source 40 and an AC voltage source 42. The bias source 40 and the AC source 42 cooperate to apply a varying voltage to electrode 14. Changing the voltage applied to the electrode 14 results in a different electrical field being applied to the layer 12 than is being applied to the layer 16. As the electrostrictive materials in the layer 12 and the layer 16 respond differently to different electrical fields, the lengths of the layer 12 and the layer 16 differ, and the system 5 bends. The voltage applied to the electrode 14 suitably may be a variable voltage if controlled bending of the system 5 is desired. If periodic motion of the system 5 is desired, the voltage applied to the electrode 14 suitably may be a biased AC source such as that generated by the bias source 40 and the AC source 42 shown in FIG. 1A.

The electrode 18, one terminal of the DC voltage source 38 and one terminal of the bias source 40 and the AC source 42 are suitably connected to a ground terminal 44.

FIG. 1B shows a top view of the bimorph actuator system 5 illustrating a suitable method of connecting the electrode 10, electrode 14, and electrode 18 to their respective power supplies. In this embodiment, the electrode 10 and electrode 18 are connected to separate terminals of the voltage source 38, respectively. The electrode 14 is connected to one terminal of the bias source 40. The other output terminal of the bias source 40 is connected to a terminal of the AC source 42. Another terminal of the AC source 42 is connected to the electrode 18. The electrode 18 is also connected to a ground terminal 44.

FIG. 1B also illustrates the power connections to the electrode 10, electrode 14, and electrode 18. The connection may include any suitable electrical connection including riveting, soldering, plug and socket, and screw terminal connections. In this exemplary embodiment, a connection 20 to the electrode 10, a connection 22 to the electrode 14, and a connection 24 to the electrode 18 suitably do not overlap. Instead, they are aligned on a connection end 28 of the bimorph actuator system 5, with the connection 22 to the electrode 14 intermediate the connection 20 for the electrode 10 and the connection 24 for the electrode 18. It will be understood that any suitable circuitry and any suitable arrangement of connections and connection types that permit applying an electrical base field to the electrode 10 and the electrode 18 while providing a variable voltage to the electrode 14 will suitably activate the bimorph actuator system 5.

FIG. 1C is a plot of voltage V over time "t" showing the different voltages applied by the DC voltage source 38, and the bias source 40 and AC source 42, to the electrodes of the bimorph actuator system 5 as shown in FIGS. 1A and 1B. The voltage source 38 applies a DC voltage differential to the electrode 10 and electrode 18 such that voltage $V_a$ at the electrode 10 is greater than voltage $V_c$ at the electrode 18. In this example, $V_a$ and $V_c$ are constant over time. Voltage $V_b$ applied to the electrode 14 varies over time. In this example, the voltage $V_b$ is a biased AC voltage varying periodically between $V_a$ and $V_c$. When $V_b$ equals $V_a$ plus $V_c$ divided by two (2), voltage $V_{ab}$ across the layer 12 equals voltage $V_{bc}$ applied across the layer 16. As the voltage $V_b$ rises, the voltage $V_{ab}$ falls, while the voltage $V_{bc}$ rises. Conversely, as the voltage $V_b$ drops, the voltage $V_{bc}$ drops, while the voltage $V_{ab}$ increases.

In FIG. 1C, the voltage $V_b$ is a periodic biased AC voltage and thus $V_{ab}$ is a sine wave function. $V_{bc}$ is the inverse of the $V_{ab}$ curve, inverted around the average voltage $V_a$ plus $V_c$ divided by two. It can be seen from FIG. 1C that as the voltage differential, and hence the electrical field across one of the electrostrictive layers is increasing the voltage differential and hence the electrical field across the other electrostrictive layer is decreasing, and vice-versa.

FIG. 2A shows a top view of an exemplary embodiment of the three (3) electrodes of the bimorph actuator system 5. The electrode 10 is suitably a sheet electrode and is shown in assembled top view configuration covering the electrode 14 and the electrode 18. The electrostrictive layers 12 and 16 are not shown. All of the connections to the electrodes are at a connection end 28 of the bimorph system 5. Each electrode has a tab with a connection. The electrode 10 has a tab 21 with a connection 20. The electrode 14 has a tab 23 with a connection 22. The electrode 18 has a tab 25 with a connection 24. The tabs and connections are all aligned along the connection end 28 of the bimorph system 5. The tab 23 is located intermediate tab 21 and tab 25, and the lateral edges 26 of the tab 23 are adjacent to tab 21 and the tab 25. As noted, any suitable alignment of electrode connections, tab shapes, and tab connection methods may be utilized to provide appropriate voltages to the electrodes 10, 14, and 18.

FIG. 2B shows an exemplary configuration for the individual electrodes 10, 14, and 18, and their tabs and connections. The electrode 10, electrode 14, and electrode 18 are shown separately, that is, unassembled. The electrode 10, electrode 14, and electrode 18 all have their tabs and connections on the same connection end 28. In this embodiment, the tab 21 is situated near a left edge 29 of the connection end 28 of the electrode 10. The tab 23 is arranged near the center 30 of the connection end 28 of electrode 14. The tab 25 is arranged near a right edge 31 of the connection end 28 of the electrode 18. It will be appreciated that with the tab 23 arranged near the center 30 of the connection end 28, the electrode 10 and the electrode 18 are substantially mirror images of each other. It will also be appreciated that the shapes of the electrode 10 and the electrode 18 may be switched. In that instance, the resulting bimorph actuator system is substantially a mirror image of the bimorph actuator system 5 shown in FIG. 2A. In this exemplary embodiment, it will be appreciated that as mirror images, the electrodes 10 and 18 may advantageously be manufactured as identical pieces. The electrode 18 is the same as the electrode 10 but simply flipped over. When the electrode 10, electrode 14, and electrode 18 are stacked with intervening layers of electrostrictive material, the resulting assemblage is shown in FIG. 1A. The electrode tabs and the electrode connections are aligned on the connection end 28 of the bimorph actuator system 5 and the connections do not overlap. This facilitates electrical connection to the bimorph actuator system 5 because the electrical connections 20, 22, and 24 do not overlap or touch. Further, the electrical connections 20, 22, and 24 are suitably near each other to facilitate providing power to the electrical connections.

FIG. 3 is a plot of strain ε versus voltage V showing the operation of the present invention. Strain ε is approximately proportional to $V^2$. The accepted equation is $\epsilon=QP^2$, where Q is the electrostrictive coefficient, with P being the polarization or charge per unit area. In an isotropic material, this can be approximated as $\epsilon=QE^2$ with E being the applied electrical field. At higher voltages, electrostrictive materials can approximate linear responses to voltage changes. As shown in FIG. 3, electrostrictive materials have a negative strain ε in response to both positive and negative voltages. Strain ε as a function of voltage is thus always negative for electrostrictive materials. Contraction or negative strain ε increases with increasing positive voltage or increasing negative voltage. In the example shown in FIG. 3, when the voltage $V_{ab}$ across the first electrostrictive layer 12 is equal to the voltage $V_{bc}$ across the second electrostrictive layer 16, the layer 12 and the layer 16 have equal generated strain if they originally have equal length and are made of the same material or respond equally to the same applied voltage. Thus, when applied voltage $V_{ab}$ equals $V_{bc}$, the layer 12 and the layer 16 still have the same length.

In the actuator system shown in FIGS. 1A and 1B, an additional biased AC voltage is applied to the electrode 14. This applies an increasing voltage across the layer 12 when a decreasing voltage is applied across the layer 16. When this occurs, strain on the layer 12 increases, and strain on the layer 16 decreases. Because the strain is negative, the layer 12 shortens and the layer 16 lengthens from their respective identical lengths when $V_{ab}$ equals $V_{bc}$. The length of the layer 12 becomes less than that of the layer 16 and the assemblage bends. Conversely, as $V_{ab}$ decreases with the result that $V_{bc}$ increases, with strain being negative with increasing voltage, the layer 16 shortens while the layer 12 lengthens. The assemblage then bends in the opposite direction. By way of example, electrical fields suitably applied to sheets of irradiated P(VDF-TrFE) are approximately 1 to 200 million volts per meter. If a periodic motion of the actuator is desired, the frequency of the AC voltage applied may range from nearly DC to up to 10 kilohertz. There is no known lower limit to how slowly this configuration can actuate.

FIGS. 4A, 4B, and 4C show the actuator system 5 in operation. If one end of the bimorph actuator system 5 is held in a holder 34, the other unrestricted end 36 deflects as varying voltages are applied to the electrostrictive materials. In FIG. 4A, the voltage $V_{ab}$ across the layer 12 is equal to the voltage $V_{bc}$ across the layer 16. Because the voltage $V_{ab}$ is equal to the voltage $V_{bc}$, both layers 12 and 16 have the same length, and the system 5 is straight. In the embodiment shown in FIG. 4A, the electrodes 10, 14, and 18 are thin, sheet metal electrodes. The electrostrictive material layers 12 and 16 are thin sheets of irradiated P(VDF-TrFE) that have equal length before any electrical field is applied. In this embodiment, the electrode 10 is attached to the layer 12, the layer 12 is attached to the electrode 14, the electrode 14 is attached to the layer 16, and the layer 16 is attached to the electrode 18 with double-stick adhesive sheets (not shown).

FIG. 4B shows deflection of the bimorph actuator 5 when the voltage applied to the electrode 14 is decreased. This increases the voltage difference $V_{ab}$ between the electrode 10 and the electrode 14 and decreases the voltage difference $V_{bc}$ between the electrode 14 and the electrode 18 with the result that $V_{ab}$ is greater than $V_{bc}$ ($V_{ab} > V_{bc}$). In this instance, the layer 12 contracts relative to its length shown in FIG. 4A, and the layer 16 expands relative to its length shown in FIG. 4A, with the result that the bimorph actuator 5 bends in a direction towards the electrode 10.

FIG. 4C shows the converse of FIG. 4B. In this instance $V_b$ is increased, with the result that the voltage difference $V_{ab}$ between the electrode 10 and the electrode 14 decreases, while the voltage difference $V_{bc}$ between the electrode 14 and the electrode 18 increases. Again, because these are electrostrictive materials where contraction increases with increasing voltage and contraction decreases with decreasing voltage, the layer 12 lengthens and the layer 16 shortens as compared to their lengths as shown in FIG. 4A when $V_{ab}$ equals $V_{bc}$. In this instance, the actuator bends in an opposite direction toward the electrode 18.

It will be appreciated that the bimorph actuator system 5 may be used to drive any number of mechanical and electromechanical systems. Examples of systems that can be driven by a bimorph electrostrictive actuator include ultrasonic speakers, making and breaking electrical contacts, optical switching, and mechanical systems such as windshield wipers.

In an ultrasonic system, or in a speaker, an electrostrictive actuator suitably may drive a diaphragm, thereby generating electro-ultrasonic pulses or sound. In an electrical system, the electrostrictive actuator suitably may make or break contacts, thereby acting as a relay. In an optical system, an electrostrictive actuator suitably may move a mirror or other optical switch, thereby switching optical transmissions. In mechanical systems, the bimorph electrostrictive actuator may activate any suitable mechanical device. Using electrostrictive materials in a bimorph actuator system permits the actuator to have a higher energy density, or, in other words, lighter weight for the same power than comparable piezoelectric actuators.

Figure 5:
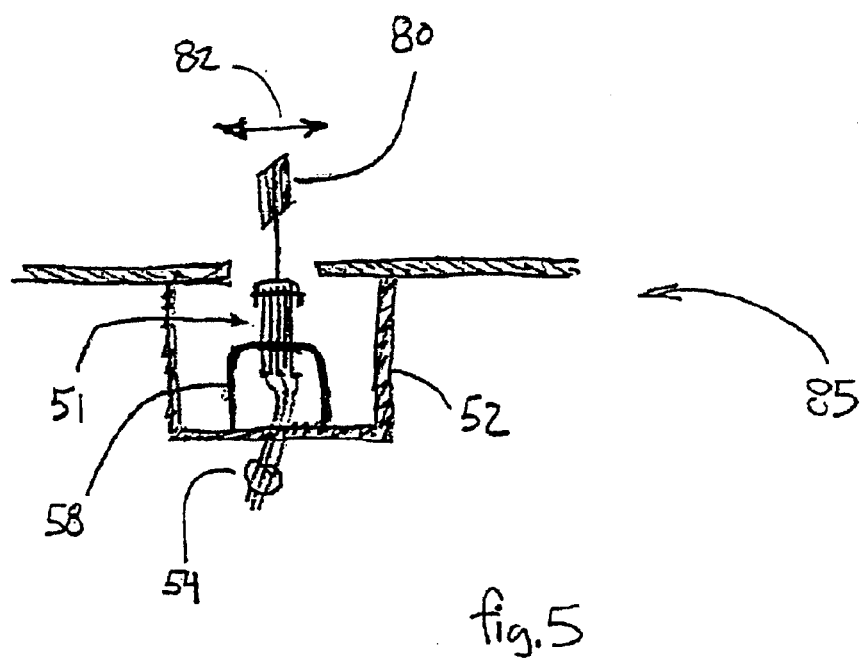
FIG. 5 is a cross-section of an energy sampler driven by the present invention.

A bimorph actuator suitably may also be used to sample movement or generate power from movement. As is known, electrostrictive materials exhibit strain when subjected to varying voltages. However, electrostrictive materials operate in a reverse direction as well, generating voltage differences when strain is applied. If a vibrating sampler is attached to a bimorph actuator, the actuator will generate a voltage differential, and that voltage differential will be higher than that produced by a piezoelectric actuator under the same strain. Thus, a bimorph actuator may be used to sample vibrations or motion, or even to generate power from vibrations or motion. By way of example, and not by limitation, FIG. 5 shows an airflow sensor system 85. A suitable paddle 80 is connected to a bimorph actuator 51. The paddle 80 is placed in an airflow 82 that causes deflection or vibration in the bimorph actuator 51. The actuator 51 is supported by an actuator support 58 attached to a frame 52, so the paddle 80 suitably projects into the airflow 82. Deflection or vibration of the paddle 80 causes the bimorph actuator 51 to deflect or vibrate, thereby generating a voltage differential. The voltage differential can be sampled through a power cable 54 connected to the bimorph actuator 51. The airflow sensor system 85 can sense deflection and vibration which can be measured by voltage derived from the bimorph actuator 51 through the power cable 54.

It will be appreciated that the bimorph actuator of the present invention may be utilized in a wide range of configurations, assemblages, and shapes depending upon the system to be driven or actuated. In one presently preferred embodiment, bimorph actuators of the present invention are arranged in linked segments and actuated to curve in opposite directions to form compound actuators. One feature of certain compound arrangements of such actuators is that they may be configured to produce deflection along a line, as opposed to an arc.

FIG. 6A is a side view of an exemplary recurve actuator 105 of the present invention. A recurve actuator 105 is a compound actuator with three curving bimorph actuator sections in alignment, with the two end electrode sections configured to curve in one direction while the central section is configured to curve in an opposite direction. In this exemplary recurve actuator 105, an intermediate electrode sheet 140 is sandwiched between a first layer 112 of electrostrictive material and a second layer 116 of electrostrictive material. A second electrode sheet 120 is arranged against the layer 112, thereby sandwiching the layer 112 between the intermediate electrode sheet 140 and the second electrode sheet 120. A third electrode sheet 160 is arranged against the layer 116 to sandwich the electrostrictive layer 116 between the electrode 140 and the electrode sheet 160. Layers 112 and 116 are suitably electrostrictive materials that contract when subject to an electrical field.

Suitable electrostrictive materials for the recurve actuator 105 are the same as those for the embodiments of the bimorph actuator described above. The electrode sheets 120, 140, and 160 may be any suitable electrical conductor sheet as described above. In the one presently preferred embodiment, the electrode sheets 120, 140, and 160 include sheets of copper.

The electrode sheet 120, layer 112, electrode sheet 140, layer 116, and electrode sheet 160 may be assembled by any suitable method that links the layer 116 to the layer 112 such that differential changes in length between the layer 112 and the layer 116 cause the recurve actuator 105 to move laterally by bending, typically in a clam-shell shaped bend or "recurve" shape. In such a bend, the first end 106 and the second end 108 of the recurve actuator 105 remain in alignment, while the center electrode section 107 of the recurve actuator 105 deflects laterally. Reversing the electrical fields applied to electrostrictive layers 112 and 116 result in an opposite lateral deflection.

Any suitable method of linking or fastening the layers 112 and 116 to each other may be utilized, including without limitation, the attachments and adhesives suitable for the embodiments of the present invention described above.

Each electrode sheet of the recurve actuator 105 is divided into sections to which differing voltages are applied, thus applying different charges across adjacent segments of the electrostrictive layers 112 and 116.

In the recurve actuator 105, the electrode sheet 120 has a first end electrode section 122, a center electrode section 124, and a second end electrode section 126. The electrode sections 122, 124, and 126 in a presently preferred embodiment utilize a copper conductor divided by gaps 129 in the conductor, thereby breaking the electrode sheet 120 into the three sections. It will be appreciated that any suitable method of dividing the conductor sections into separate areas may be utilized, including bars of insulation, or alternate layers that are not electrically connected. It will be appreciated that the first end electrode section 122, the center electrode section 124, and the second end electrode section 126 are not electrically connected within the electrode sheet 120 in this exemplary embodiment. Depending upon the recurve deflection desired, or if alternate widths or shapes of the recurve actuator 105 are utilized, the end electrode sections may be electrically connected or otherwise linked together.

The intermediate electrode sheet 140 is divided into a first end electrode section 142 and a second end electrode section 144 by a gap 149 in the middle 107 of the electrode sheet 140. In this exemplary recurve actuator 105, as further described in FIG. 6B below, the gap 149 separating the two electrode sections 142 and 144 facilitates the electrical connections to the electrode sheet 120 and the electrode sheet 160. In this embodiment, both sections 144 and 142 of the electrode sheet 140 are driven by the same voltage. Thus, a gap or separation between section 142 and section 144, while advantageous for electrical connections, is not required for the recurve actuator 105.

The third electrode sheet 160 is divided into three sections. Like the electrode sheet 120, the third electrode sheet 160 has a first end electrode section 162, a center electrode section 164, and a second end electrode section 166. The first end electrode section 162 is separated from the center electrode section 164 and the center electrode section 164 is separated from the second end electrode section 166 by gaps 169.

FIG. 6B shows a top view of the exemplary recurve actuator 105 shown in FIG. 6A. The recurve actuator 105 is connected to the electrical drive circuit as described in reference to FIGS. 1A, 1B, and 1C above. A DC voltage 38 is applied to the end electrode sections 122, 126, 162, and 166 and the center electrode sections 124 and 164 (designated "a" & "c" when driven by voltages equal to $V_a$ and $V_b$ respectively) of FIG. 6A. A bias source 40 and AC voltage source 42 is connected to the central electrode sheet 140 (designated "b" when driven by a voltage equal to $V_b$). The drive system 39 is suitably connected to a ground terminal 44.

FIG. 6B, by way of example but not limitation, shows an embodiment of the electrode sheet configurations utilized to form a recurve actuator 105 of the present invention. Electrostrictive layers 112 and 116 of the recurve actuator 105 as shown in FIG. 6A do not appear in FIG. 6B because they are typically translucent or transparent. Thus, the top view of the recurve actuator 105 as shown in FIG. 6B shows the entire electrode sheet 120, closest to the viewer, those portions of the electrode sheet 140 not covered by the electrode sheet 120, and those portions of the electrode sheet 160 not covered or obscured by electrode sheets 120 and 140, looking downward through the sandwich of the electrode sheets 120, 140, and 160, respectively.

In FIG. 6B, a $V_a$ conductor 101 from the DC voltage source 38 is coupled to the first end electrode section 122 of sheet 120 through a connection 121. The connection 121 is further coupled to the center electrode section 164 of sheet 160 through a connection 163 and to the second end electrode section 126 of the sheet 120 through a connection 125 by electrical conductor 117. It will be noted that all $V_a$ connections are denoted "a" on FIG. 6B. By way of example and not limitation, an electrical conductor 117 connecting connections 121, 163, and 125 is suitably a wire running from the first end 106 to the second end 108. This conductor 117 advantageously allows the "a" or $V_a$ sections of the recurve actuator 105 to be driven from one end—in this instance the first end 106. It will be appreciated that the conductor 117 is connected to the connection 163 of the center electrode section 164 of the electrode sheet 160 without shorting to the center electrode section 124 of the electrode sheet 120, or electrode sections 142 and 144 of the intermediate electrode sheet 140. This is because, in this embodiment, the connection 163 is suitably situated in a notch 127 defined in the center electrode section 124 of the sheet 120. Connection 163 is also suitably situated in the center gap 149 in the electrode sheet 140 (not shown in this view). Thus, part of the center electrode section 164 of the electrode sheet 160 is visible through a gap 129 in the center electrode section 124 of electrode sheet 120, and through a center gap 149 in the electrode sheet 140 because the conductors do not overlap in the location of the connection 163 to the center electrode sections 164 of the electrode sheet 160. This permits the center electrode sections 164 of the electrode sheet 160 to be driven in parallel with the end electrode sections 122 and 126 of the electrode sheet 120 without shorting to the other electrode sections.

In FIG. 6B, the two electrode sections 142 and 144 of the intermediate electrode sheet 140 are visible through the gaps 129 in the conductor sections of the sheet 120. The first end electrode section 142 and second end electrode section 144 are driven by the $V_b$ conductor 102 from the bias source 40 and the AC source 42 through a connection 141 to the first end electrode section 142 and through a connection 145 to the second end electrode section 144. In this embodiment, the connection 141 is suitably located at the end 106 of the recurve actuator 105 and connection 145 is suitably located at second end 108 of the recurve actuator 105. The connection 145 is coupled to the connection 141 through a conductor 118 running from the end 108 to the end 106 of the recurve actuator 105. By way of example and not limitation, the conductor 118 between the connections 141 and 145 is suitably a wire. This advantageously permits the sections 142 and 144 of the electrode sheet 140 to be driven from the first end 106 of the recurve actuator 105. It will be appreciated that the conductor 118 may be replaced with an alternate connection between the sections 142 and 144 of the intermediate electrode sheet 140. Such a connection suitably may be a conductor bridge on the electrode sheet 140 itself.

In this embodiment, a $V_c$ conductor 103 completes the driving connections to the recurve actuator 105 by connecting the ground 44, the DC voltage source 38, and the bias source 40 and AC source 42 to the first end electrode section 162 of electrode sheet 160, the center electrode section 124 of electrode sheet 120, and the second end electrode section 166 of electrode sheet 160. The $V_c$ conductor 103 is suitably connected through the connection 161 on the end 106 to the first end electrode section 162. A conductor 119 runs from the connection 161 to the connection 123 at the center electrode section 124 of the electrode sheet 120 and to the connection 165 at the second end 108 to the second end electrode section 166 of the electrode sheet 160. In this embodiment, the conductor 119 is suitably a wire running from the end 108 to the end 106 of the recurve actuator 105. This permits the $V_c$ conductor 103 to be suitably connected to the recurve actuator 105 on the first end 106 of the recurve actuator 105.

As shown in FIG. 6B, the electrical connections 121, 141, and 161 suitably do not overlap. Similarly, the electrode connections 123 and 163 in the center 107 suitably do not overlap. Likewise, the electrode connections 125, 145, and 165 at the second end 108 suitably do not overlap. Because the referenced connections do not overlap and thus do not short to each other, the electrical connections suitably may be through-rivets. It will be appreciated that any suitable electrode section connection or configuration end type may be utilized for the recurve actuator 105, including the alternate connections described in connection with FIG. 1B above. It will be appreciated that the electrode configurations described in FIGS. 6A and 6B when driven by voltages $V_a$, $V_b$, and $V_c$ produce alternating charge potentials across the electrostrictive layers of the recurve actuator 105.

Figure 6C:
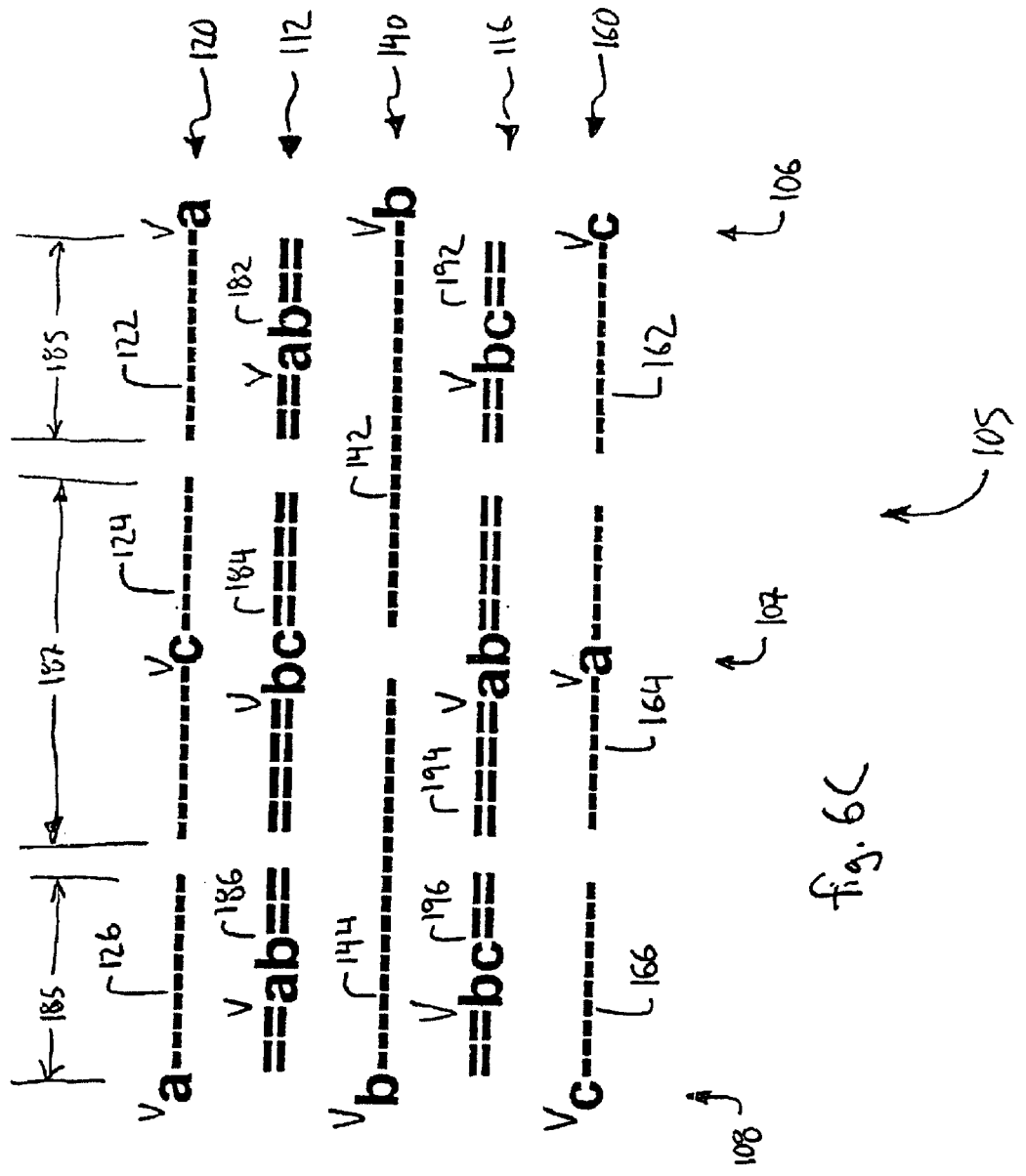
FIG. 6C is a symbolic side view of a recurve actuator.

FIG. 6C is a side view symbolic diagram of the electrode sections of electrode sheets 120, 140, and 160 and the voltages applied to the electrode sections and adjacent segments of the electrostrictive layers 112 and 116. The intermediate electrode sheet 140 contains a first end electrode section 142 and a second end electrode section 144; they are both driven at a voltage $V_b$. Adjacent to the intermediate electrode sheet 140 on one side is the electrostrictive layer 112. Adjacent the electrostrictive layer 112 and across the electrostrictive layer 112 from the intermediate electrode sheet 140 is the second electrode sheet 120. The electrode sheet 120 is driven in three sections—a first end electrode section 122, a center electrode section 124, and a second end electrode section 126. The first end electrode section 122 and the second end electrode section 126 are driven at a voltage equal to $V_a$. The center electrode section 124 is driven at a voltage equal to $V_c$. In this embodiment, the lengths 185 of the first end electrode section 122 and the second end electrode section 126 are equalized with each other and around half as long as the length of the center electrode section 124 (which has a center length 187). As will be described below in connection with FIGS. 7A, 7B, and 7C, by way of example but not limitation, arranging the two end electrode sections 122 and 126 in equal lengths, with lengths 185 equal to half of the length 187 advantageously permits the recurve actuator 105, when activated, to deflect in a recurve or a half clam-shell shape, thereby maintaining the ends 106 and 108 in parallel and in the same plane.

On the opposite side of the electrode sheet 140 from the layer 112 is an electrostrictive layer 116. Adjacent to the electrostrictive layer 116, and across layer 116 from the intermediate electrode sheet 140 is the electrode sheet 160. Like electrode sheet 120, the electrode sheet 160 is divided into 3 sections—a first end electrode section 162, a center electrode section 164, and a second end electrode section 166. The end electrode sections 162 and 164 are driven at a voltage equal to $V_c$ while the central section 164 is driven at a voltage equal to $V_a$. Also, like electrode sheet 120, the end electrode sections 162 and 166 are of equalized length 185 of around one-half the length 187 of the center electrode section 164. With the entire intermediate electrode sheet 140 suitably driven at a variable voltage of $V_b$, it will be appreciated that the electrostrictive layers 112 and 116 experience an electrical field with a voltage potential equal to the voltage difference between $V_a$ and $V_b$ for the segments of the electrostrictive layers in segments adjoining the sections of the electrode sheet 120 and the electrode sheet 160 driven at $V_a$. The electrostrictive layers 112 and 116 also experience an electrical field with a voltage potential equal to the difference between $V_b$ and $V_c$ in the segments adjoining the sections of the electrode sheets 120 and 160 driven at $V_c$. Thus, the first electrostrictive layer 112 is subject to an electrical field with a voltage equal to $V_{ab}$ in the end segments 182 and 186.

The center segment 184 of electrostrictive layer 112 is subject to an electrical field of the voltage equal to $V_{bc}$ where it adjoins the center electrode section 124 of electrode sheet 120, which is driven at $V_c$. Because the center electrode section 124 of electrode sheet 120 has a length 187 that is around twice as long as the length 185 of the end electrode sections 126 and 122, the end segments 182 and 186 of electrostrictive layer 112 subject to an electrical field of $V_{ab}$ are half as long as the central segment 184 subject to an electrical field of $V_{bc}$. Conversely, on the opposite side of the intermediate electrode sheet 140, the end electrode sections 162 and 166 are driven at a voltage of $V_c$, while the central section 164 is driven at a voltage of $V_a$. Thus, the second electrostrictive layer 116 is subject to an electrical field with a voltage potential of the $V_b$, on its two end segments 192 and 196, and a voltage potential of $V_{ab}$ in its center segment 194. Because the lengths 185 of the two end electrode sections 162 and 166 are equalized, and are around half the length 187 of the center electrode section 164, the end segments 192 and 196 thus are driven at a voltage equal to $V_{bc}$ are equalized in length and and around half as long as the center segment 194 driven with a voltage field Of $V_{ab}$.

It will be appreciated that electrode sheet 120 and electrode sheet 160 in cross-section as shown in FIG. 6C are mirror images of each other mirrored across the intermediate electrode sheet 140, but driven with alternate base voltages. In other words, the $V_c$-driven sections are driven with the $V_a$ and the $V_a$-driven sections are driven at $V_c$. Put differently, the two end electrode sections of electrode sheet 120 are driven at $V_a$ while its center electrode section is driven at $V_c$. Meanwhile, the two end electrode sections 162 and 166 of sheet 160 are driven at $V_c$, while its center electrode section is driven at $V_a$.

When the recurve actuator 105 is driven with $V_a$, $V_b$, and $V_c$ as described in connection with FIGS. 1A, 1B, and 1C, above, it will be appreciated that as the voltage potential across the segments of the electrostrictive layers driven with $V_a$ are rising, the electrical potential across those segments driven at voltage $V_c$ are dropping. The recurve actuator 105 is thus three segments of bimorph actuators similar to that described in FIGS. 1A and 1B placed end-to-end, with adjoining segments driven to curve in opposite directions.

As $V_{ab}$ increases, the end segments 186 and 182 of the electrostrictive layer 112 contract while the end segments 196 and 192 of the second electrostrictive layer 116 expand. This causes these linked end segments (the mechanical linkage between the electrostrictive layers 112 and 116 is not shown in FIG. 6C) to cup towards the electrostrictive layer 112 side. At the same time, the center segment 184 of electrostrictive sheet 112, driven by an electrical field of potential $V_{bc}$, expands and the center segment 194 of the second electrostrictive layer 116, driven at an electrical potential of $V_{ab}$, contracts. This causes the center segments 194 and 184 which are linked together (the mechanical linkage between layers 116 and 112 are not shown in FIG. 6C) to cup or curve with an inside of the curve toward the section electrostrictive layer 116 side. The result is a recurve shape, or a half clam-shell with the two end electrode sections curving in the opposite direction from the central and longer center electrode section. When $V_{ab}$ decreases and $V_{bc}$ decreases the converse occurs. That is, the end segments 186 and 196, and 182 and 192, respectively, cup or curve with the inside of the curve towards the second electrostrictive layer 116. At the same time, the central segment made of segments 184 and 194 of the electrostrictive layer 112 and the electrostrictive layer 116 respectively cup towards, or curve with the inside of the curve towards, the electrostrictive layer 112. The result is a half clamshell or recurve shape with an opposite deflection from that when $V_{ab}$ is greater than $V_{bc}$.

The deflection of the recurve actuator 105 when $V_{ab}$ and $V_{bc}$ varies with the variation in $V_b$ as shown in FIGS. 7A, 7B, and 7C. FIG. 7A shows the recurve actuator 105 when $V_{ab}$ equals $V_{bc}$. When $V_{ab}$ equals $V_{bc}$, the recurve actuator 105 is straight. As $V_{ab}$ increases and $V_{bc}$ correspondingly decreases, as shown in FIG. 7B, the recurve deflects in a clam-shell curve with the middle 107 deflecting and the ends 106 and 108 remaining parallel. Conversely, when $V_{ab}$ decreases and $V_{bc}$ increases, the center 107 deflects in an opposite direction with the ends 106 and 108 remaining parallel as shown in FIG. 7C.

In FIG. 7A, the first end 106 and the second end 108 are connected to attachments 104 which hold the ends. As in FIGS. 6A, 6B, and 6C, the recurve actuator 105 is suitably a 5-layer sandwich with the intermediate electrode sheet 140 in the middle with the electrostrictive layer 112 and the electrode sheet 120 on one side of the intermediate electrode sheet 140, and the second electrostrictive layer 116 and the third electrode sheet 160 on the other side of the electrode sheet 140. At the first end 106, the second electrode sheet 120 has a first end electrode section 122 driven at a voltage equal to $V_a$. The middle section 124 of the second electrode sheet 120 is driven at a voltage equal to $V_c$. The second end electrode section 126 of the second electrode sheet 120 is also driven at a voltage equal to $V_a$. The intermediate electrode sheet 140 consists of a first end electrode section 142 and a second end electrode section 144. Both sections 142 and 144 are driven at a voltage equal to $V_b$. Thus, the entire intermediate electrode sheet 140 is driven at a voltage equal to $V_b$. The third electrode sheet 160 has three sections like sheet 120. Its first end electrode section 162 at the end 106 is driven at a voltage equal to $V_c$. Its center electrode section 194 is driven at a voltage equal to $V_a$. The second end electrode section 166 is driven at a voltage equal to $V_c$.

The pattern of electrodes and corresponding electrical fields placed on the first electrostrictive sheet 112 and second electrostrictive 116 in FIG. 7A, as well as FIGS. 7B and 7C as described below, is suitably the same as symbolically shown in FIG. 6C. In FIG. 7A, the end electrode sections 122 and 126 are around half as long as the center electrode section 124 of the second electrode sheet 120. Similarly, the two end electrode sections 162 and 166 of the third electrode sheet 160 are around half as long as the center electrode section 124. The end electrode sections of the second and third electrode sheets 120 and 160 are around half as long as their center electrode sections and are equalized to each other. As a result, when the center segments curve in one direction and the end segments curve in the opposite direction at the same radius of curve, the ends 106 and 108 remain parallel. Further, driving the recurve actuator 105 in this fashion, with its first end segment curving one way and its middle segment of around twice the length of the end segments curving the other way, and a second end segment curving back, suitably results in all of the layers of the recurve actuator 105 having the same total length from end 106 to end 108, resulting in no sheer between the electrode sheets and electrostrictive layers of the recurve actuator 105 at the ends 106 and 108. Thus, the ends of the recurve actuator 105 can be held by the attachments 104 at the ends 106 and 108 that pin all the layers of the recurve actuator 105 together. Similarly, there is no sheer between the layers of the recurve actuator 105 at the center 107 of the recurve because the recurve actuator 105 when activated has equivalent s-curves towards each end 106 and 108 symmetrically around the center 107.

FIG. 7B shows the recurve actuator 105 when activated with $V_{ab}$ greater than $V_{bc}$. The electrode sheets 120, 140, and 160, attachments 104, ends 106 and 108, and center electrode section 107 are as described in connection with FIG. 7A. When $V_{ac}$ is greater than $V_{bc}$, portions of the electrostrictive layers 112 and 116 between electrode sections driven at a voltage equal to $V_a$ and $V_b$ are shorter than those between electrode sections driven at voltages equal to $V_b$ and $V_c$. In FIG. 7A, this causes the end segments of the recurve actuator 105 to curve towards the first electrostrictive layer 112 and the middle segment 107 of the recurve actuator 105 to curve in the opposite direction towards the second electrostrictive sheet 116. This results in a deflection 118 of the middle 107 equal to +Δ. As shown in FIG. 7B, the center segment of the recurve actuator 105 is around twice as long as each of the end segments of the recurve. Thus, the center segment curves in one direction the end electrode sections curves in the other. This forms a recurve or half clam-shell shape while the ends 106 and 108 remain parallel.

It will be appreciated that a recurve actuator 105 need not be generally one-dimensional, in other words deflecting simply along its length. The recurve actuator 105 may be suitably disc or diaphragm-shaped, or cross or multi-pointed asterisk shaped. In such embodiments, the deflection 118 when $V_{ab}$ is greater than $V_{bc}$ would be in cross-section the same as shown in FIG. 7B. However, the actuator suitably would develop greater deflecting force or would apply deflection force across a wider area.

FIG. 7C is the converse of FIG. 7B. In FIG. 7C, the recurve actuator 105 is driven with $V_{ab}$ less than $V_{bc}$. The result is a deflection 118 equal to −Δ in the opposite direction from that shown in FIG. 7B. In FIG. 7C, the ends 104 and 106 of the recurve actuator 105 with $V_{ab}$ less than $V_{bc}$ cup towards, or curve with the lower radius towards, the second electrostrictive layer 116, while the center 107 segment cups or curves toward the first electrostrictive layer 112. The electrode sheets, segments, layers, ends and attachments of the recurve actuator 105 in FIG. 7C are the same as described in connection with FIG. 7A. When driven with $V_{ab}$ less than $V_{bc}$, the recurve actuator 105 assumes a recurve shape or half clam-shell opposite from that when $V_{ab}$ is greater than $V_{bc}$.

FIG. 8A shows an exemplary embodiment of electrode sheets of an exemplary recurve actuator system 105. The electrode sheets 120, 140, and 160 are suitably sheet electrodes, and are shown in assembled top view with the second electrode sheet 120 above the intermediate electrode sheet 140, both of which in turn are above the third electrode sheet 160. The electrostrictive layers 112 and 116 are not shown.

All of the connections to the sections of the electrode sheets are at the first end 106, the second end 108, and the center 107 of the electrode sheets 120, 140 and 160. Each electrode sheet 120, 140 and 160 has a tab, 131, 151, and 171, respectively, at the end 106, and a tab 133, 153, and 173, respectively, at end 108. Each tab is a projection from the electrode sheet at the ends 106 and 108, respectively, with each tab having an electrical connection. The tab 131 has an electrical connection 121 at the end 106, the tab 151 has an electrical connection 141 at the end 106, and the tab 171 has an electrical connection of 161 at the end 106. At the opposite second end 108, the tab 133 has an electrical connection of 125 at end 108, tab 153 has an electrical connection 145 at the end 108, and tab 173 has an electrical connection 165 at end 108. The second electrode sheet 120 and the third electrode sheet 160 also have connections at their center 107. The connection 123 is coupled to the center electrode section 124 of the electrode sheet 120. The connection 163 is coupled to the center electrode section 164 of third electrode sheet 160.

It will be appreciated that in this embodiment none of the electrical connections 121, 141, 161, 125, 145, 165, 123, and 124 overlap. As noted above, this facilitates coupling the electrical connections to the electrode sections by allowing through-rivets or bolts to be used as the electrical connections. At the end 106, the tab 151 is intermediate the tab 131 and the tab 171. At the end 108, the tab 153 is intermediate the tab 133 and the tab 173. In this embodiment, the tabs 153 and 151 of the electrode sheet 140 and their respective electrical connections 145 and 141 are situated on the centerline 100 of the recurve actuator 105. This places the end connection tabs 131 and 133 of second electrode sheet 120 toward a first side 109 from the centerline 100, away from the tabs and connections of the intermediate electrode sheet 140. Conversely, the end tabs 173 and 171 of electrode sheet 160 and their respective electrical connections 165 and 161 are on the opposite or second side 111 of the centerline 100 of the recurve actuator 105, away from the tabs 151 and 153 and electrical connections 141 and 145 of the intermediate electrode sheet 140. In this embodiment the connections 123 and 163 to the center electrode sections of the second electrode sheet 120 and the third electrode sheet 160, respectively, are located at the center 107 of the recurve actuator 105 on opposite sides of the centerline 100 from each other. In this exemplary embodiment, the electrical connection 123 to the center electrode section 124, is towards the second side 111 of the recurve actuator 105 at the center 107, while the end connections 121 and 125 are towards the first side 109 at their respective ends 106 and 108.

The connections to the third electrode sheet 160 are a mirror image of the second electrode sheet 120, mirrored across the centerline 100 of the recurve actuator 105. The center connection 163 is towards the first side 109 from the centerline 100 of the recurve actuator 105 at the center 107. The end connections 161 and 165 are towards the second side 111 at their respective ends 106 and 108.

In this embodiment, the intermediate electrode sheet 140 includes a first end electrode section 142 and a second end electrode section 144 driven from their first end 106 and second end 108, respectively. In this assembled top view, the first end electrode section 142 and the second end electrode section 144 are visible through gaps 129 in the second electrode sheet 120 between the first electrode section 122 and the center electrode section 124, and between the center electrode section 124 and second end electrode section 126, respectively. It will be appreciated that the electrode connections 123 and 163 to the sections 124 and 164, respectively, do not overlap the electrode sections 142 and 144 of the intermediate electrode sheet 140. Instead there is advantageously a gap (not shown) between the two sections 142 and 144 of the intermediate electrode sheet 140.

FIG. 8B is a disassembled view of the three individual electrode sheets 120, 140, and 160 of the recurve actuator 105. The upper electrode sheet in FIG. 8B is the second electrode sheet 120. The middle electrode sheet in FIG. 8B is the intermediate electrode sheet 140. The bottom electrode sheet in FIG. 8B is the third electrode sheet 160.

The electrode sheet 120 includes the first end electrode section 122 at the first end 106, the center electrode section 124 at the center 107, and the second end electrode section 126 at the end 108. The first end electrode section 122 is separated from the center electrode section 124 by a gap 129. The center electrode section 124 is separated from the second end electrode section 126 by a gap 129.

The first section 122 is of equalized length to the second end electrode section 126. Both in turn are around half the length of the center electrode section 124. In FIG. 8B, the same ratio applies to the end sections and center section of the third electrode sheet 160, described below.

The first end electrode section 122 has a connection tab 121 with an electrical connection 131 at the end 106. The first end connection tab 131 and first end connection 131 on the first side 109 of centerline 100 of the recurve at first end 106. The second end Q) connection tab 123 at the other end of the second electrode sheet 120 is on the same first side 109 of the centerline 100 at the end 108. The second end connection tab 123 to the second end electrode section 126 has an electrical connection 125.

The center electrode section 124 has a notch 127 at its center 107 on the first side 109 so that the center electrode section 124 does not overlap the center electrode connection 163, on the third electrode sheet 160. The notch 127 extends around two-thirds of the way from the first side 109 of electrode sheet 120 towards the second side 111. The notch may be of any suitable width or shape so that the center electrode section 124 of second electrode sheet 120 does not overlap the center connection 163 to the third electrode sheet 160 situated below the intermediate electrode sheet 140 from the second electrode sheet 120 when the electrode sheets are assembled together. In alignment with the notch 127 at the center 107, but not within the notch 127 itself, is the center connection 123 to the center electrode section 124. The center connection 123 is thus towards the second side 111 of the center electrode section 124 (the notch 127 is towards the first side 109). The center electrode connection 123 is located towards the second side 111 so that it falls within a notch 167 in the center electrode section 164 of the third electrode sheet 160, when the electrode sheets are assembled. The notch 167 has the same function as the notch 127 in second electrode sheet 120. This advantageously prevents the center electrode section 164 of the third electrode sheet 160 from overlapping the center electrode connection 123 to the center electrode section 124 of the second electrode sheet 120.

The intermediate electrode sheet 140 (the center electrode sheet in FIG. 8B), has a first end electrode section 142 at the end 106 and a second end electrode section 144 at end 108. The two sections are divided by a center gap 149. The first end electrode section 142 has a connection tab 151 with an electrical connection 141. The connection tab 151 and the electrical connection 141 are situated on the centerline 100 of the recurve actuator 100. The connection tab 151 at the end 106 of the intermediate electrode sheet 140 has two edges 156 on opposite sides of the centerline 100 from the electrical connection 141. The connection tabs 131 and 171 are arranged away from the center line 100 of the recurve actuator 105 from these edges so that the tabs 131, 151, and 171 do not overlap. Tabs 131 and 171 are thus arranged on opposite edges 156 of the tab 151 at the end 106. A similar arrangement of tabs is at the opposite end 108 electrode sheets. A second end tab 153 is linked to the second end electrode section 144 of the intermediate electrode sheet 140. The tab 153 has an electrical connection 145, and both the tab 153 and the connection 145 are on the centerline 100 at the end 108. The tab 153, similar to the tab 151, has two edges 156 on opposite sides of the centerline 100 from the electrical connection 145. The tabs 133 and 173 on end 108 are arranged on opposite sides of the center line 100 outside of the edges 156 of the tab 153. As a result, the tabs 133, 153, and 173, and their accompanying electrical connections 125, 145, and 165, respectively, do not overlap at end 108.

The third electrode sheet 160 is a mirror image of the second electrode sheet 120 mirrored across the centerline 100. The third electrode sheet has a first section 162 at the end 106, a center electrode section 164 at the center 107, and a second end electrode section 166 at the end 108. The first end electrode section 162 is separated from the center electrode section 164 by a gap 129. The center electrode section 164 is separated from the second end electrode section 166 by another gap 129. The first end electrode section 162 has a connection tab 171 with an electrical connection 161 at the end 106. The first end connection tab 171 of the third electrode sheet 160 is located towards the second side 111 of the centerline 100 at the end 106. The second end connection tab 173 is located towards the same second side 111 at the opposite second end 108. The second end electrode tab 173 at the end 108 has an electrical connection 165. As noted above, arranging the end connections 171 and 173 towards the second side 111 prevents them from overlapping and thus shorting out to the end connections 131 and 133 which are situated towards the first side 109, or across the center line 100 of the recurve.

The center electrode section 164 has a center connection 163 located at the center 107. It will be appreciated that when the second electrode sheet 120, intermediate electrode sheet 140, and third electrode sheet 160 are stacked, the center electrical connection 163 to the center electrode section 164 falls within the center gap 149 of the intermediate electrode sheet 140, and the notch 127 in the first side 109 of the second electrode sheet 120. Therefore, the center connection 163 does not overlap with, or short out to, any of the electrode sections or connections on the intermediate electrode sheet 140 or the second electrode sheet 120. Put differently, the center electrical connection 163 on the center electrode section 164 of the third electrode sheet 160 at the center 107 is located towards the first side 109 of the recurve actuator 104. This is the same side that defines the notch 127 in the second electrode sheet 120.

The center electrode section 164 of the third electrode sheet 160 also defines a center notch 167 to prevent the center electrode section 164 from overlapping and thus shorting to the center electrode connection 123. In this example, the notch 167 is a mirror image of notch 127. The notch 197 in this exemplary embodiment extends approximately two-thirds of the way across the center electrode section 164 from the second side 111 toward the first side 109.

Summarizing FIG. 8B, the second electrode sheet 120 has end connection tabs 133 and 131 on the first side 109 of the recurve actuator 105 while having its center connection 123 on the opposite, or second side 111 of the recurve actuator 105. The end connection tabs 171 and 173 on third electrode sheet 160 are the converse of this, and are thus situated on the second side 111 of the recurve actuator 105, while the center connection 163 of the third electrode sheet 160 is on the first side 109 of the recurve actuator 105. The second electrode sheet 120 notch 127 extends in from the first side 109 at the center 107, while the notch 167 in the center electrode section 164 of the third electrode sheet 160 extends in from the second side 111. As noted above, the electrode sheet 120 is a mirror image of third electrode sheet 160 across the centerline 100. For manufacturing purposes, this mirror imaging is advantageously accomplished by simply flipping or rotating the electrode sheet 120 by 180 degrees around the centerline 100 of the recurve actuator 105. Thus, the second electrode sheet 140 is suitably the same as the third electrode sheet 160 for manufacturing purposes.

A bridge connection between the first end electrode section 142 and the second end electrode section 144 of the intermediate electrode sheet 140 suitably could be arranged along the center line 100 of the intermediate electrode sheet 140. Such a bridge connection may connect the two sections 142 and 144 without overlapping or shorting to the center electrode connections 123 and 163. This is because the notches 167 and 127 in this embodiment extend approximately two-thirds the way across their respective electrode sheets 160 and 120. Such a bridge would permit the intermediate electrode sheet 140 to be driven from either end 106 or 108 without the necessity of driving both ends with a voltage equal to $V_b$.

As with the arrangement of connections in the bimorph actuator described in FIGS. 1A and 1B above, any suitable alignment of electrode connections, tab shapes, and tab connections may be utilized to provide to provide appropriate voltages to the electrode sections 122, 124, 142, 144, 162, 164, and 166.

As shown in FIGS. 9A and 9B, it will be appreciated that multiple recurve actuators may be arranged in an array to increase the total deflection available for driving mechanical devices and other equipment. FIGS. 9A and 9B are cross-sections of an array 205 of two recurve elements 207 and 209 arranged to create a deflection 218 that is about double the deflection from that obtained from a single recurve array. In FIG. 9A, a first recurve actuator 207 is a recurve actuator similar to that described in FIGS. 6, 7 and 8 above, or a multi-layer recurve actuator as described in connection with FIGS. 10 and 11 below. The actuator 207 is attached at its center 227 to a device 220 to be moved or deflected. The first element 207 has a first end connection 206 and a second end connection 208 both of which are connected to a second recurve element 209. The first end connection 206 and the second end connection 208 are arranged so that the first recurve element 207 and the second recurve element 209 clear each other sufficiently so that both may deflect their full range in both directions as the voltages applied to the first and second elements 207 and 209 vary. By way of example, but not limitation, the end connections 206 and 208 suitably may include spacers to provide clearance between the two recurve elements 207 and 209

The ends of the second recurve element 209 connect at the first end connection 206 to the first element 207 and at the second end connection 208 to the opposite end of first element 207. The center 217 of the second element. 209 is attached to a base 210. In summary, the array 205 is thus connected to a base 210 at the middle of the second element 209 and is connected to the device 220 being driven at the center 227 of the first element 207, with the two elements 207 and 209 connected at their respective ends by end connectors 206 and 208. The two end connections 206 and 208 in this exemplary embodiment are free to move as the array is actuated, but the end connections may be attached or stabilized in other embodiments.

The array 205 generates deflection of the device 220 being driven by actuating the two recurve elements 207 and 209 in opposite directions. This causes the centers 207 and 217 of the two arrays to open to deflect away from each other when the array 205 is expanded, as in FIG. 9A, and the centers 207 and 217 to contract or retract toward each other when the array 205 is retracted, as in FIG. 9B. By driving the first element 207 opposite from the second element 209, the total deflection 218 of the array 205 equals around twice that of either of the elements 207 or 209 alone. The mechanical device 220 being driven thus is pushed away from the base 210 when the array 205 extends, and the device 220 is pulled toward the base 210 when the array contracts. The net deflection 218 of the array 205 thus equals around 2Δ, where Δ is the amount of deflection obtainable by a single recurve actuator. It will be appreciated that if the two elements 207 and 209 are driven at a resonant frequency that the deflection 218 may be larger than if the array 205 is driven at a frequency that is not resonant. It will be appreciated that recurve arrays such as the array 205 shown in FIGS. 9A and 9B may be connected in series or in parallel with other actuators to obtain either further increased deflection or increased force of deflection.

It will also be appreciated that FIGS. 9A and 9B are side views of recurve actuator arrays that have a generally one-dimensional (length>>width) rectangular configuration similar to that described in FIGS. 6, 7, and 8. Thus, it will be appreciated that two-dimensional, as opposed to generally one-dimensional, arrays are possible utilizing two-dimensional recurves such as wide (width>>length), disc-shaped (circular), cross-shaped (such as a "red cross" shaped cross), or multi-pointed asterisk or star-shaped recurve actuators driven with their center segments curving in opposite directions from their end or edge segments. It will also be appreciated that recurve actuators, as well as arrays based on such actuators, may be extended laterally. This results in actuators or arrays that are wide and short, as opposed to narrow and long. Similarly, arrays may overlap or be mechanically attached in any suitable fashion to obtain either increased force to be applied to the device being driven or increased deflection.

It will be appreciated that the force that can be derived from a recurve actuator can be increased by increasing the number of electrostrictive layers in the actuator. FIGS. 10A and 10B provide exploded and symbolic views, respectively, of an exemplary multi-layer recurve actuator of the present invention. FIG. 10A is an exploded perspective side view of a six layer recurve actuator 350 with six layer units 300, 302, and 304 above a central reference plane 305, and three layer units 306, 308, and 310 below the reference plane 305. Each of the layer units 300, 302, 304, 306, 308, and 310 includes electrode sections that drive a sheet of electrostrictive material 112 incorporated in each layer. In this embodiment, each of the layer units 300, 302, 304, 306, 308, and 310 includes a sandwich of an intermediate electrode sheet 140, a sheet of electrostrictive material 112, and second electrode sheet 120. Each layer has the same component sheets, but is oriented differently in the multi-layer stack that forms the multi-layer recurve actuator 350.

Returning to FIG. 8B it will be appreciated that the third electrode sheet 160 is a mirror image or a rotation along the center line 100 of the second electrode sheet 120. Thus, it will further be appreciated that a three layer sandwich of the intermediate electrode sheet 140, the electrostrictive sheet 112, and the second electrostrictive sheet 120, in that order respectively, is identical to, albeit rotated 180 degrees around the centerline 100, a sandwich of the intermediate electrode sheet 140, the electrostrictive sheet 112, and the third electrode sheet 160. This same three layer sandwich is included in each of the layer units 300, 302, 304, 306, 308, and 310 of the multi-layer recurve actuator 350 in FIG. 10A, albeit rotated in different orientations.

FIG. 10A thus is an exploded isometric view of the six layers of the multi-layer recurve actuator 350. The center reference plane 305 forms a center reference plane defining the orthogonal x-axis 321 (right to left in FIG. 10A) and y-axis 324 (towards the viewer and away from the viewer in perspective in FIG. 10A). In this exemplary embodiment all of the layer units 300, 302, 304, 306, 308, and 310 are rectangular and of equal size. They are longer in the x direction than they are wide in the y direction. All layers are aligned with their lengths 351 in the x-axis 321. The layers have their midpoints 352 centered at the origin of the x-axis 321/y-axis 324. The layers are stacked above and below the reference plane 305 with their midpoints 352 along the orthogonal z-axis 323 (up and down in FIG. 10A), directly above 320 or below 330 the x-axis 321/y-axis 324 origin. Layer units 304, 302, and 300 are located above 320 the reference plane 305 stacked along the z-axis 323. Layer unit 304 is closest to the reference plane 305. Moving up, layer unit 302 is next, and layer unit 300, in this embodiment, is furthest above 320 the reference plane 305. Below 340 the reference plane 305 are layer units 306, 308, and 310 centered on the z-axis 323 at increasing distance from the reference plane 305, respectively. When assembled, all the layer units 300, 302, 304, 306, 308, and 310 are stacked immediately adjoining the neighboring layer. The multi-layer recurve actuator 350 thus has six sheets of electrostrictive material 112. Each electrostrictive sheet 112 is sandwiched between a pair of electrode sheets 120 and 140. Not shown in FIG. 10A are the attachment or attachments between the layer units 300, 302, 304, 306, 308, and 310. In a presently preferred embodiment, the attachments are double-stick mylar sheets between the layers. However, any suitable method of attachment may be utilized, including without limitation the methods described in connection with FIG. 1A above. Each electrode sheet 120 has a center electrode section 124 and two end electrode sections 122 and 126. Each intermediate electrode sheet 140 has two electrode sections 144 and 142. The electrode sections may be driven by any appropriate configuration of connections and attachments. In the embodiment shown in FIG. 10A, the connections are as shown on the corresponding electrode sheets 140 and 120 in FIG. 8B above.

It will be appreciated that to form a recurve shape or a half clam-shell shape, the ends of the electrostrictive material 112 in the end segments 360 of the layer units 300, 302, 304 above the reference plane 305 are driven in an opposite sense from the end segments 360 in the layer units 306 308 and 310 below the reference plane 305. Similarly, the center segments 361 of the layer units 300, 302, and 304 above the reference plane 305 are driven opposite their respective end segments 360, and also opposite the center segments 361 of the layer units 306, 308, and 310 below the reference plane 305. It will be appreciated that the references herein to below and above the reference plane 305 are for descriptive purposes only, and the multi-layer recurve array 350 may be oriented at any angle appropriate to the device being driven by the actuator.

In this embodiment, the two sections 142 and 144 of the intermediate electrode sheet 140 in every layer unit are driven at a voltage equal to $V_b$. This is true for all the layer units 300, 302, 304, 306, 308, and 310. Above the reference plane 305, the end electrode sections 122 and 126 of the second electrode sheets 120 of layer units 300, 302, and 304 are driven with a voltage equal to $V_a$. The center electrode sections 124 of second electrode sheets 120 of the layer units 300, 302 and 304 above the reference plane 305, are driven with a voltage $V_c$. In FIG. 10A, as in FIG. 8B, the end electrode sections 122 and 126 of electrode sheets 120 are equalized in length and around one half of the length of the center electrode section 124. Thus, the end one-quarters, or end segments 360, of the electrostrictive sheet 112 in each layer unit 300, 302, and 304 experience an electrical field with a potential Of $V_{ab}$, while the center two-quarters, or center segments 361, of each electrostrictive sheet 112 above the reference plane 305 experience an electrical field with a voltage potential of $V_{bc}$.

Conversely, below the reference plane 305, the end electrode sections 126 and 122 of each of the layer units 306, 308, and 310 are driven at a voltage equal to $V_c$, while their respective center electrode sections 124 are driven at a voltage $V_a$. The same as above the reference plane 305, the end electrode sections 122 and 126 of layer units 306, 308, and 310 below the reference plane 305 are equalized in length, and are around half the length of the center electrode sections 124. Thus, both end one-quarters, or end segments 360, of the electrostrictive material 112 in each of the layer units 306, 308, and 310 experience an electrical field of voltage potential $V_{bc}$, while their center two-quarters, or center segments 361 experience an electrical field of voltage potential $V_{ab}$.

This is shown symbolically in FIG. 10B. The multi-layer recurve actuator 350 has three layer units 300, 302, and 304 above the reference plane 305 and three layer units 306, 308, and 312 below the reference plane 305. The electrode sections driven by $V_a$ are symbolically denoted "A," the electrode sections driven by $V_b$ are symbolically denoted "B," and the electrode sections driven with voltage equal to $V_c$ are denoted "C". Starting at the reference plane 305 and moving up through layer units 304, 302, and 300 sequentially, nine components are encountered—three in each of the three layers above the reference plane 305. Moving above the reference plane 305, first is the intermediate electrode sheet 140 of layer unit 304, with both electrode sections 142 and 144 driven at a voltage equal to $V_b$. Second is a sheet of electrostrictive material 112 of layer unit 304. Third is the second electrode sheet 120 of layer unit 304 with its end electrode sections 122 and 126 driven at a voltage equal to $V_a$ and with its a center electrode section 124 driven at a voltage of $V_c$. Fourth, above layer unit 304 is layer unit 302 with the second electrode sheet 120, with its end electrode sections 122 and 126 driven at a voltage equal to $V_a$, and its center electrode section 124 driven at a voltage equal to $V_c$. Fifth is the electrostrictive material sheet 112 of layer unit 302. Sixth is the intermediate electrode sheet 140 of layer unit 302 driven at a voltage equal to $V_b$ in both of its electrode sections 142 and 144. Above layer unit 302 is layer unit 300, and thus seventh is an intermediate electrode sheet 140 with its two electrode sections 144 and 142 both driven at a voltage equal to $V_b$. Eighth is the electrostrictive sheet 112 of the layer unit 300. Ninth, and last in this exemplary embodiment, is the second electrode sheet 120 of layer unit 300 with its end electrode sections 120 sections 126 and 122 driven at a voltage of $V_a$ and its center electrode section driven at a voltage equal to equal to $V_c$. The layering of the same nine components occurs in the same sequence in layer units 306, 308, and 310, below the reference plane 305, starting at the reference plane 305 and moving down, but with the end electrode sections 126 and 122 driven at a voltage equal to $V_c$, and with the center electrode sections 124 driven at a voltage equal to $V_a$.

It will be appreciated that adjoining layers, such as layer units 304 and 302, have their adjoining electrode sheets being the same. In this example, adjoining electrode sheets of the layer units 304 and 302 are both second electrode sheets 120 driven with a voltage $V_a$ in their end electrode sections 122 and 126, and a voltage of $V_c$ in their middle electrode sections 124. As a result, when the layers are stacked in this manner, adjoining electrode sheets of adjoining layers (which have no electrostrictive material 112 between them) have the same applied voltages in their respective end and center electrode sections. Thus there is no voltage leakage or field formed between the layer units. This is true throughout the stack of the multi-layer recurve actuator 350. The layers are all oriented so that intermediate electrode sheets 140 of the respective layers abut intermediate electrode sheets 140 of adjoining layers, while the second electrode sheets 120 of the respective layers adjoin second electrode sheets 120 of the adjoining layers. The intermediate electrode sheets 140 of layer units 304 and 306 abut each other at the reference plane 305.

Reviewing the internal symmetry of the stack of the multi-layer recurve actuator 350 in FIG. 10B, it will be appreciated that layer units 304 and 300 are identically oriented, while the intermediate layer unit 302 is the same as layer units 304 and 300 but inverted around its electrostrictive layer 112. Similarly, the layer units 306 and 310 below the reference plane 305 are identically oriented while the intermediate layer unit 308 is inverted around its electrostrictive layer 112. From the symmetry of FIG. 10B, the electrode sheets immediately adjoining the reference plane 305 are both intermediate electrode sheets 140, with all their sections 142 and 144 driven at a voltage equal to $V_b$. In function, therefore, it will be appreciated that the layer units 304 and 306 adjoining each other across the reference plane 305 encompass two electrostrictive layers 112 with electrode sheets 140 between them driven at a voltage equal to $V_b$, and second electrode sheets 120 outside of them driven with their ends at opposite voltage potentials $V_a$ and $V_c$, respectively, and their center electrode sections driven at opposite voltage potentials $V_c$ and $V_a$, respectively. This forms functionally the same recurve configuration as in FIG. 6C. The remaining layer units 302 and 300 above the reference plane 305 and layer units 308 and 310 below the reference plane 305 strengthen and add deflective force to the recurve. As a result, the multi-layer recurve actuator 350 deflects in the same manner as shown in FIGS. 7A, 7B and 7C, but with additional deflecting force.

Returning to FIG. 10A, layer units 302 and 308 functionally remain the same when placed into the stack inverted from their adjoining layer units 300 and 304, and 306 and 310, respectively. In other words, their end segments 360 of electrostrictive material 112 are subject to the same electric charge as the adjoining layers ($V_a$ for layer units 300, 302 and 304, and $V_c$ for layer units 306, 308 and 310). It will be appreciated, however, that inverting the layer unit 304 around the x-axis 321 to form the layer unit 302 without a second rotation results in an overlap of electrode connections when the multi-layer recurve actuator 350 is connected to its power source. However, if the layer unit 304 is rotated 180 degrees around its x-axis (i.e., inverted around its electrostrictive sheet 112) and then spun 180 degrees around its z-axis 323 to form the layer unit 302, the electrical connections of the second electrode sheet 120 of the layer units 302 and 304 are advantageously aligned (not shown—shown in detail in FIG. 11).

Assembly of the multi-layer recurve actuator 350 utilizing identical layer units as shown in FIG. 10A, from furthest above 320 the reference plane 305 to furthest below 330 the reference plane 305 with the six layer units thus starts with layer unit 300. Layer unit 302 is identical to layer unit 300 but rotated 180 degrees around its length 351 or x-axis 321 and spun 180 degrees along its vertical or z-axis 323. Layer unit 304 is oriented the same as layer unit 300. Below the reference plane 305, layer unit 306 is identical to layer unit 300 rotated 180 degrees on its longitudinal or x-axis 321. Layer unit 308 is identical to layer unit 300, but rotated 180 degrees on its vertical or z-axis 323. Layer unit 310 is oriented the same as layer unit 306, that is the same as layer unit 300 rotated 180 degrees around its length 351 or x-axis 321.

In one presently preferred embodiment, each of the six layers are attached to its one or two neighbors with double-sided adhesive mylar sheets to form a unitary multi-layer recurve actuator 350. In the orientation shown in FIG. 10A, when $V_{ab}$ is greater than $V_{bc}$, the center of the multi-layer recurve actuator 350 curves upward, above 320 the reference plane. When $V_{ab}$ is less than $V_{bc}$, the actuator deflects downward, below 330 the reference plane 305. Both deflections form a recurve shape similar to that shown in FIGS. 7B and 7C, respectively.

FIG. 11 is an exploded isometric view of the electrode configurations of an exemplary embodiment of a multi-layer recurve actuator 350 of the present invention. In this embodiment, the multi-layer recurve actuator again has six layer units 300, 302, 304, 306, 308 and 310. Each layer unit includes an intermediate electrode sheet 140 and a second electrode sheet 120 with an intermediate electrostrictive sheet (not shown).

Layer unit 300 furthest above the reference plane 305 includes an intermediate electrode sheet 140 and a second electrode sheet 120. These electrode sheets are suitably in configured the same as the intermediate electrode sheet 140 and the second electrode sheet 120 described in FIG. 8B. The intermediate electrode sheet 140 and the second electrode sheet 120 are assembled into a layer unit 300 with a layer of electrostrictive material (not shown) intermediate them. The layer unit 300 has a first end 106 and a second end 108, a first side 109, and a second side 111. The layer unit 300 is rectangular, and its length 351 between its ends 106 and 108 is longer than its width 353 between sides 109 and 111. In FIG. 11, the electrode sheets 120 and 140 are oriented parallel to the reference plane 305, and the ends 106 and 108 of the layer unit 300 are aligned along an x-axis 321 (right to left in FIG. 11), with their midpoint centered on a vertical axis or z-axis 323 (up or above and down or below in FIG. 11). In layer unit 300, the second electrode sheet 120 is above 320 the intermediate electrode sheet 140. Second electrode sheet 120 has a connection tab 131 on its first end electrode section 122 at the first end 106 (to the right in FIG. 11). Second electrode sheet 120 has a second end connection tab 133 at the second end 108 (to the left in FIG. 11). Both the first end connection tab 131 and the second end connection tab 133 are located towards the first side 109 of the second electrode sheet 120 from the center line or x-axis 321 of the second electrode sheet 120 (in perspective, away from the viewer from the x-axis 321 in FIG. 11).

As in FIG. 10A, the lengths of the end electrode sections 126 and 122 are equalized, and around one-half the length of the center electrode section 124. As noted above, the center electrode section is around twice as long as the two end electrode sections. This permits the ends of the recurve to remain parallel when the center electrode section is deflected up or down.

The center electrode section 124 of the second electrode sheet 120 has a center electrical connection 123. The center connection 123 is located approximately equi-distant between the ends 106 and 108 at a center 107 of the second electrode sheet 120 and towards the second side 111 of the second electrode sheet 120 from the centerline or x-axis 321 (in perspective, towards the viewer from the x-axis 321 in FIG. 11). Also located at the center 107 of the second electrode sheet 120 is a notch 127 defined in the center electrode section 124. The notch extends from the first side 109 of the second electrode sheet 120 at its center 107 approximately two-thirds of the way towards the second side 111 of the second electrode sheet 120. As described above, the notch 127 allows the second electrode sheet 120 to be inverted and/or overlapped. As a result, alternating center electrode sections 124 of the other layer units can be connected without their respective $V_a$ and $V_c$ connections overlapping, and thus shorting out, if by way of example and not limitation, the $V_a$ and $V_c$ connections are through-bolted or riveted. The first end electrode section 122 of the second electrode sheet 120 is separated from the center electrode section of the second electrode sheet by a gap 129. Similarly, the center electrode section 124 is separated from the second end electrode section 126 by another gap 129. In this view, the two electrode sections 142 and 144 of the underlying intermediate electrode sheet 140 in the layer unit 300 are visible through the gaps 129 in second electrode sheet 120. The intermediate electrode sheet 140 of layer unit 300 has a first end electrode section 142 and a second end electrode section 144 separated by a gap (not shown) at the center 107. At the first end 106 of the intermediate electrode sheet 140 a connection tab 151 is located along the centerline or x-axis 321. The connection tab 151 has an electrical connection 145. Similarly, on the second end 108, the intermediate electrode sheet 140 has a connection tab 153 with an electrical connection 145, also located along the centerline or x-axis 321. The end connection tabs 131 and 133 of the second electrode sheet thus do not overlap the end connection tabs 151 and 153 of the intermediate electrode sheet 120, respectively. Further, the end connection tabs 131 and 133 of the second electrode sheet 120 are arranged towards the first side 109 of the second electrode sheet 120 in FIG.

11. In FIG. 11, the layer unit 300 is located with its first end 106 to the right and its second end 108 to the left.

In this configuration, the $V_b$ connection 102 to the intermediate electrode layer 140, including both first end electrode section 142 and second end electrode section 144, is coupled to electrical connections 145 at the centerline or x-axis 321 of the layer unit 300. The end electrode sections 122 and 126 of the second electrode layer 120 are coupled to the $V_a$ conductor 101 by electrical connections 121 and 125 respectively, at their respective electrical tabs 131 and 133 (in perspective view, towards the first side 109 back from the centerline or x-axis 321 of the layer unit 300). The center electrode section 124 of the second electrode sheet has its electrical connection in the center 107 of the layer unit 300 along the y-axis 325, towards the second side 111 (in perspective view; forward from the centerline or x-axis 321 of the layer unit 300). The $V_c$ conductor 103 is attached to the center electrode section 124 of the second electrode layer 120 of layer unit 300 at its connection point 123.

It will be appreciated that in the exemplary embodiment in FIG. 11, all of the intermediate electrode sheets 140 of all of the layer units 300, 302, 304, 306, 308, and 310 are driven from end connection tabs at the ends of the intermediate electrode sheets 140.

To recapitulate the orientation of layer unit 300, its upper electrode sheet is the second electrode sheet 140. The two end electrode sections 122 and 126 being driven by a voltage $V_a$ are arranged in perspective away from the viewer from the x-axis or centerline 321. Electrode sheet 140 has a center electrode section 124 driven at a voltage $V_c$ with the connection in perspective towards the viewer from the centerline 321. These orientations are specifically noted because the balance of the layer units of the multi-layer recurve actuator 350 are identical layer units to unit 300 either rotated around their x-axis 321, around their z-axis 323, or rotated around both their x and z-axes. It will be appreciated that alternative rotational moves such as rotation around the y-axis 325 or other combinations of rotations can result in similar orientations.

Layer unit 302, is substantially identical to layer unit 300, but is oriented as if layer unit 300 was rotated 180 degrees around its x-axis 321 and then spun 180 degrees along its z-axis 323. All of the component references in layer unit 302 are the same as for layer unit 300. By rotating layer unit 300 around its x-axis and then spinning it around its z-axis, the intermediate electrode sheet 140 is now above or further away from the reference plane 305 in relation to the second electrode sheet 120 of layer unit 302. This rotation places the first end 106 of the layer unit 302 to the left and the second end 108 to the right. However, the first side 109 of layer unit 302 in perspective view remains away from the viewer while the second side 111 remains towards the viewer. This is the same side-to-side configuration of layer unit 300. The result is that the electrode connections 121 and 125 to the end electrode sections 122 and 126 of the second electrode layer 120 (not visible in Layer 302 because they are covered by the intermediate electrode sheet 140) are arranged away from the viewer from the x-axis or centerline 321 of the layer unit 302. The connections 121 and 125 are thus in vertical alignment with connections 125 and 121 of the end electrode sections 126 and 122 of the layer unit 300 above. The connection 121 for layer unit 302 to $V_a$ conductor 101 is aligned below the $V_a$ end connection 125 for layer unit 300 above, both to the left. Similarly, connection 125 to the $V_a$ conductor 101 at the second end 108 on layer 302 is aligned under its corresponding end connection 121 in the layer unit 300 above, both to the right.

The center electrode section 124 of the second electrode sheet 120 of layer unit 302 is driven by its center connection 123. That connection 123 is visible through the central gap 149 in the two electrode sections 142 and 144 of the intermediate electrode sheet 140. The central connection point 123 of layer unit 302 is in perspective view is located towards the viewer from the x-axis 321 along the y-axis 325 in vertical alignment with, or directly below, the center electrode connection 123 for the layer unit 300 above. The end electrode sections 142 and 144 of the intermediate electrode layer 140 of layer unit 302 are both driven from their respective ends 106 and 108 on connection tabs 151 and 153, respectively, with electrical connections 145 to the $V_b$ conductor 102, on the centerline or x-axis 321.

Layer unit 304 includes the same components and configuration as layer unit 300 and is oriented identically to layer unit 300, but is stacked below layer unit 302 and immediately above the reference plane 305. Oriented identically with layer unit 300, layer unit 304 has its second electrode sheet 120 above its intermediate electrode sheet 140. The first end electrode section 142 and 144 of the intermediate electrode layer 140 are both driven from their respective ends 106 and 108 on connection tabs 151 and 153, respectively, with electrical connections 145 to the $V_b$ conductor 102. The two end electrode sections 122 and 126 of the second electrode sheet 120 of layer unit 304 are driven at their respective ends 106 and 108 through connections 121 and 125 on connection tabs 131 and 133, respectively. Connection tab 131 to the right, and connection tab 133 to the left 333, are arranged in perspective view behind the centerline or x-axis 321 of layer unit 304.

It will be appreciated that this arrangement of layer units 300, 302, and 304 allow the center electrode sections 124 to be driven by the $V_c$ conductor 103 through the center connections 123 at the center 107. In addition, in all three layer units 300, 302 and 304, the connections 123 to the $V_c$ conductor 103 are, in perspective view, towards the viewer from the x-axis or centerline 321 of layer units 300, 302 and 304. Conversely, the $V_a$ conductors 101 are in vertical alignment behind, or away from the viewer from the x-axis 321 and thus behind the connections 145 to the respective end electrode sections 142 and 144 of the intermediate electrode sheets 140 of each of the three layers. For this to occur, layer units 300, 302 and 304 all have their second side 111 towards the viewer and their first side 109 away from the viewer.

Each layer unit above the reference plane 305 thus has five electrical connections: a $V_c$ conductor 103 connected to each center electrode section 124; two $V_a$ conductors 101, one at each end 106 and 108, connected to the end electrode sections 122 and 124; and two $V_b$ conductors 102, one at each end 106 and 108, connected to the two electrode sections 142 and 144.

The layer units 306, 308, and 310 below the reference plane 305 are further rotations of a layer unit with the same components and configuration as layer unit 300. Layer units 306, 308 and 310 all have their first side 109 towards the viewer and their second side 111 away from the viewer. Layer unit 306 has its first end 106 to the right and its second end 108 to the left. Layer unit 308 has its first end 106 towards the left and its second end 108 towards the right. Layer unit 310 is oriented the same as layer unit 306, with its first end 106 to the right, and its second end 108 to the left. As in layer unit 300, layer units 306, 308, and 310 have five electrical connections each. Both end electrode sections 124 and 122 of the second electrode sheets 120 of the three layers units 306, 308, and 310 below the reference plane 305 are connected to the $V_c$ conductor 103. To the left, he $V_c$ conductor 103 is connected to connection 125 on tab 133 on end 108 of layer unit 306, to tab 131 with connection 121 on end 106 of layer unit 308, and connection 125 on tab 133 on end 108 of layer unit 310. To the right, the $V_c$ conductor 103 is connected to tabs on the 131 and connection 131 at end 106 of layer unit 306, connection 125 on tab 133 of end 108 on layer unit 308, and tab 131 with connection 121 on end 106 of layer unit 310. The $V_c$ conductor 103 connections to the tabs on the left ends and on the right ends are all towards the viewer from the centerline or x-axis 321 of the layer units 306, 308, and 310. This is in contrast to the end electrode sections of the second conductor sheets 120 of the layer units 300, 302 and 304 above the reference plane 305 which are connected to $V_a$ conductor 101 away from the viewer from the centerline or x-axis 321. Thus, the end connections to the $V_a$ conductors 101 on both ends of the layer units 300, 302 and 304 above the reference plane 305 do not overlap with the connections to the $V_c$ conductors 103 on both ends of the layer units 306, 308, and 310 below the reference plane 305. The connections to the $V_a$ conductors 101 on the ends of the layer units can thus be through-bolted or through-riveted or through-connected without shorting to the $V_c$ conductors 103, and vice versa.

The center electrode section 124 of the second electrode sheet 120 of the three layer units 306, 308, and 310 below the reference plane 305 are all connected to a $V_a$ conductor 101. With the layer units 306, 308, and 310 oriented as described above, these connections 123 to the center conductor section 124 of these three layers is located at the center 107 between the two ends 106 and 108 of each of the layers. Further, these connections 123 are, as viewed in perspective, away from the viewer from the centerline or x-axis 321. This is in contrast to the $V_c$ conductor 103 connection to the center electrode sections of the three layer units 300, 302, and 304 above the reference plane 305, which are towards the viewer from the centerline or x-axis 321 of the unit layers. Like the ends, it will be appreciated that the $V_a$ conductor 101 and the $V_c$ conductor 103 can be through connected to the center electrode sections 124 of the three layers below the reference plane 306, 308, and 310, and the three layers above the reference plane 300, 302, and 304, respectively, without overlapping or shorting.

It will thus be appreciated that by manufacturing a number of layer units in the configuration of layer unit 300, a multi-layer array 350 can be assembled with a number of layer units above the center reference plane 305, and a number of layer units below the reference plane, thereby forming a multi-layer recurve actuator 350. In this example embodiment there are three such layer units above the reference plane 305 and three layer units below, but a lesser or greater number of layer units may be utilized. It will be appreciated that additional layer units add more deflection force to the multi-layer recurve actuator until their combined stiffness and thickness affects the deflection of the actuator.

It will be appreciated that the x, y and z-axes given in FIG. 11, and the respective directions and perspectives along and from the reference plane 305 are for reference only. It will be appreciated that the multi-layer recurve actuator 350, like the recurve actuator described in reference to FIGS. 6A and 6B, may be of any suitable two-dimensional shape. By way of example and not limitation, instead of a rectangular shape with a longer length along the x-axis 321 than width along the y-axis 325, a multi-layer recurve actuator may be wider on the y-axis 325 than it is long along the x-axis 321 thereby forming a linear actuator. Alternately, a multi-layer recurve actuator suitably may be disc-shaped, cross-shaped, or a multi-pointed star or other outline on the x-y plane thereby forming a multi-layer recurve that would generate additional force to deflect with its center while maintaining the rim or ends co-planar. Such actuators, by way of example and not limitation, suitably may also be assembled into multi-element arrays, with linear, cylindrical, cross or star shaped outlines. It will be appreciated that the multi-layer recurve actuator and recurve actuator arrays of the present invention may be utilized to drive a wide variety of devices and equipment.

FIGS. 12A, 12B, and 12C show the operation of a recurve array actuator 205 driving a synthetic jet 400. A synthetic jet 400 generates turbulence along a surface 420 by drawing air in and out through an opening 412 in the surface 420. FIG. 12A shows a synthetic jet 400 driven by an exemplary recurve array actuator 205 of the present invention. In FIG. 12A, the recurve array actuator 205 is shown in the relaxed position, this is neither extended nor retracted. The recurve array actuator 205 in FIGS. 12A, 12B, and 12C, by way of example and not limitation, is suitably of the same configuration as the recurve array actuator described in FIGS. 9A and 9B above. The recurve array actuator 205 has two recurve elements 207 and 209 that are driven through electrical connections 407 and 409 respectively. The electrical connections cause the two recurve elements 207 and 209 to alternately curve toward each other in a retracted configuration as shown in FIG. 12C, and curve away from each other in an extended form as shown in FIG. 12B. The recurve array actuator 205 is connected to a diaphragm 410 through a linkage 408 at the center 227 of recurve element 207. As described in connection with FIGS. 9A and 9B, the ends 231 of the first recurve element 207 are linked to the ends 231 of the second recurve element 209. The center 217 of the second recurve element 209 is linked to a base 210 which, in this embodiment, supports the array actuator 205 and provides a fixed position from which the diaphragm 410 is driven by the array actuator 205. The first recurve element 207 and the second recurve element 209 are driven through the electrical connections 407 and 409 by a drive circuit (not shown) such as that described in connection with FIGS. 1A and 1B. The first recurve element 207 and the second recurve element 20 may be driven at a periodic frequency which may be mechanically resonant for the first array element 207 and the second array element 209. This causes the diaphragm 410 to move back and forth with a greater amplitude that would occur if the periodic frequency was not mechanically resonant. The first array element 207 and the second array element 209 when resonate act as flat springs deflected in alternate directions at their centers.

The diaphragm 410 is a flexible diaphragm of a suitable material bridging the gap 412 in the surface 420. As the diaphragm 410 moves back and forth it draws air in and out of the synthetic jet 400, thereby inducing turbulence along the surface 420.

In FIG. 12B the recurve array actuator 205 is shown in the extended position with the first recurve element 207 curving away from the second recurve element 209. This forces the linkage 408 and the connected diaphragm 410 away from the base 210. This drives air out 444 of the opening or gap 412, thereby forming the synthetic jet 400.

In FIG. 12C, the recurve array actuator 205 is shown in the retracted position where the first recurve element 207 and the second recurve element 209 curve toward each other. This pulls the linkage 408 and the attached diaphragm 410 towards the base 210 and away from the surface 420. This draws air in 442 to the opening 412 in the surface 420. Synthetic jets have a wide variety of aerodynamic applications including placement on air foils. For example, synthetic jets 400 can assist shaping air flows over such an air foil (not shown). It will be appreciated that multi-layer recurve actuators, as well as single layer recurve actuators, suitably may be used to form the array driving the synthetic jet 400.

Figure 4:
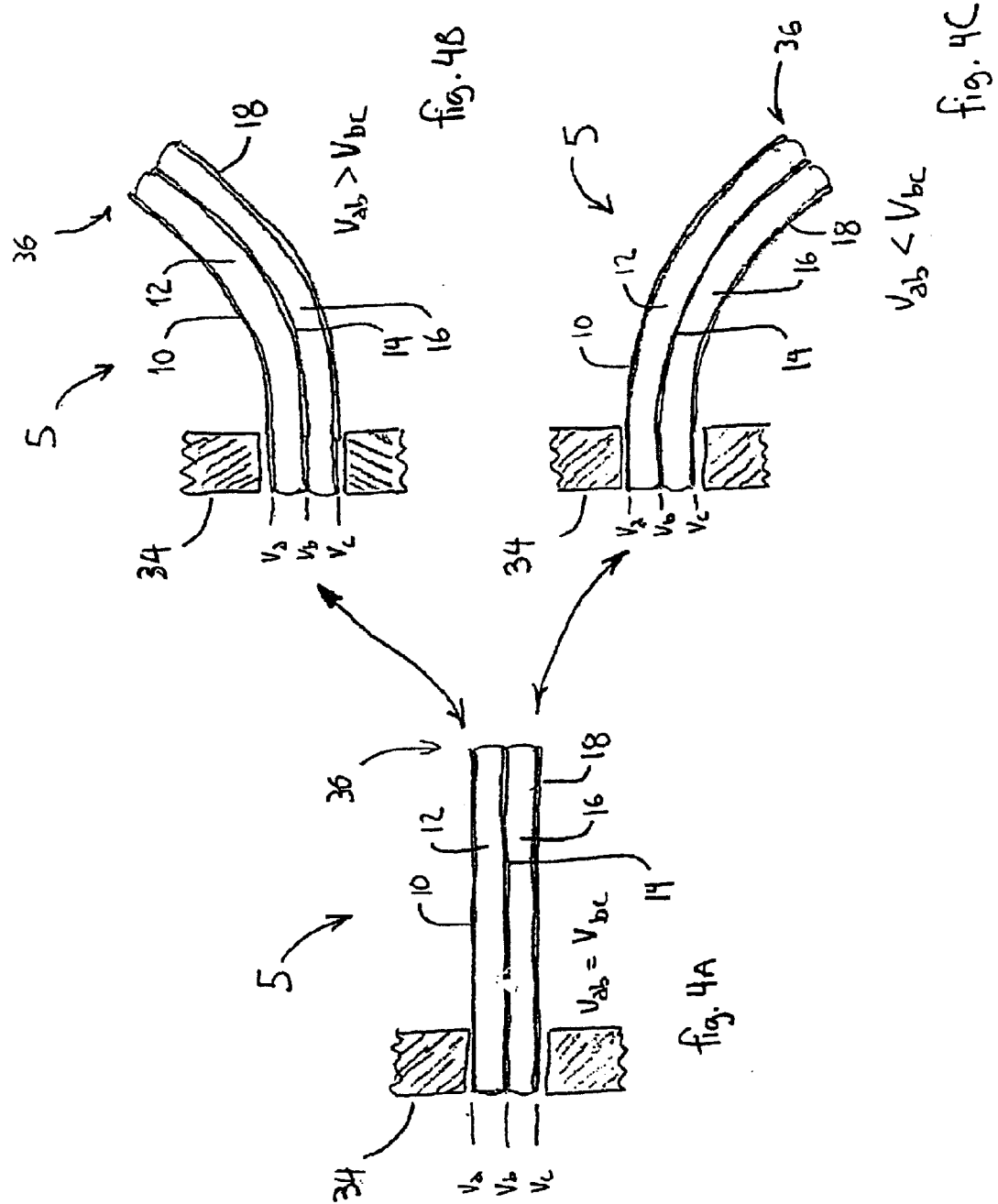
FIG. 4A is a side view of the present invention.
FIG. 4B is a side view showing bending of the present invention.
FIG. 4C is a side view showing opposite bending of the present invention.

It will be appreciated that embodiments of the recurve actuators of the present invention, such as those described in FIGS. 6, 7, and 8, the multi-layer recurve actuator as described in FIGS. 10 and 11, the recurve actuator array described in FIG. 9, and the synthetic jet system driven by a recurve actuator array in FIG. 12, may also be assembled using multiple basic form electrostrictive actuators such as described in FIGS. 1, 2, and 4, assembled or linked end-to-end. The recurve shapes of the recurve actuator, multi-layer recurve actuator, and recurve actuator array may be generated by four electrostrictive actuators of equal size suitably assembled or attached end-to-end with the two end actuators curving one way, and the center two actuators curving the opposite direction when this compound actuator is activated. It will be appreciated that the lengths of the respective segments of such a compound actuator may be suitably varied if, for a desired application, the ends of the compound actuator need not remain parallel or co-planar. It will also be appreciated that the number of actuator segments in a compound actuator need not be four as in a recurve actuator, but may be any number depending upon the desired deflection and shape of deflection desired.

In general form, a compound actuator may have at least two actuator segments curving in opposite directions when the activating electrical fields $V_{ab}$ and $V_{ac}$ vary inversely to each other. A compound actuator therefore has at least two oppositely driven actuator segments attached to each other so as to form an s-curve when activated. It will be appreciated that two, two-segment, s-curve compound actuators placed end-to-end suitably form a recurve actuator as described above. Restated, a two-segment s-curve compound actuator is thus a half-recurve actuator. Such a two segment s-curve actuator can be understood by considering at either end half of the recurve actuator described in FIGS. 6, 7, and 8.

A compound actuator may also be described by its base unit including a combination of two adjoining, oppositely-driven electrostrictive actuator segments that form an s-curve when activated. FIGS. 13A, 13B, and 13C show the operation of a compound actuator 505 with a first segment 570 and a second segment 572. In this exemplary embodiment, the compound actuator 505 is a two segment s-curve actuator. The compound actuator has, a first electrostrictive layer 512 and a second electrostrictive layer 516. It will be appreciated that compound actuators may be assembled utilizing multiple layers of electrostrictive material in the manner described above in connection with a multi-layer recurve actuator. In FIGS. 13A, 13B, and 13C, the compound actuator 505 is shown in cross-section, showing deflections and dimensions in the x axis 321-z axis 323 axes.

In this exemplary embodiment, the first segment 570 of the compound actuator 505 is to the right and the second compound segment 572 of the compound actuator 505 is to the left. The left end 560 of the compound actuator 505 is held by a support 504 while the right end 562 of the compound actuator 505 in this example is unrestrained and may move as the compound actuator is activated. By way of example and not limitation, the first segment 570 of the compound actuator has a length 185 equalized to the length 185 of the second segment 572. Activation of the compound actuator 505 thus results in the deflection of the right end 562 of the compound actuator 505 either up or down in the z-axis direction 323, while the right end 562 of the compound actuator 505 remains parallel to the left end 560 even as it deflects along the z-axis 323. Deflection of the compound actuator 505 in the up direction is shown in FIG. 13B, and deflection of the compound actuator 505 in the down direction is shown in FIG. 13C. The electrode configuration of the compound actuator 505 is similar to that of the electrostrictive actuator described in FIGS. 1 and 2 and the recurve actuators described in FIGS. 6, 7, and 8, and 10 and 11 above. Between the first electrostrictive layer 512 and the second electrostrictive layer 516 is an intermediate electrode sheet 540 driven at a voltage equal to $V_b$. In this example, the first electrostrictive layer 512 is above the intermediate electrode sheet 540, and the second electrode sheet 516 is below the intermediate electrode sheet 540. It will be appreciated that the directions and axes utilized in connection with FIGS. 13A, 13B, and 13C are for descriptive purposes only, and different reference directions and axes and orientations of the actuators may be utilized to describe or install the actuator in a device utilizing it.

The compound actuator 505 has two second electrode sheets 520, one above the first electrostrictive layer 512 and the other below the second electrostrictive layer 516. The compound actuator 505 has two second electrode sheets 520. This is because the upper electrode sheet 564, located above the first electrostrictive layer 512 is a second electrode sheet 520 with two sections 522 and 524. The bottom electrode sheet 568, below the second electrostrictive layer 516, is also a second electrode sheet 520, with the same configuration as the upper electrode sheet 564. However, the bottom electrode sheet 560 is rotated (not shown) as described below in connection with FIGS. 14A and 14B. The exemplary compound actuator 505 thus is a five-layer sandwich, which from the top or upper side to the lower or bottom includes a top electrode sheet 564 including a second electrode sheet 520, the first electrostrictive layer 512, the intermediate electrode sheet 540 which may also be labeled as the middle electrode sheet 562, the second electrostrictive layer 516, and the bottom electrode sheet 568 including a second electrode sheet 520. As noted, the bottom electrode sheet 568 is suitably in the same outline as the top electrode sheet 564, but is rotated and placed on the bottom of the compound actuator 505. As with the recurve actuators described above, the electrostrictive layers and the electrode sheets may be attached to each other in any suitable manner such that differential changes in the lengths of the electrostrictive layers results in deflection of the compound actuator 505.

In this embodiment, the upper electrode sheet 564 has a first electrode section 522 and a second electrode section 524 divided by a gap 529. The length 185 of the first electrode section 522 is equalized toward the length 185 of the second electrode section 524. There is a gap 529 between the two sections 522 and 524. This is because the two sections 522 and 524 are driven at different voltages. In this example, the first electrode section 522 of the upper electrode sheet 564 to the right is driven at a voltage equal to $V_c$ in the first segment 570. The second electrode section 524 of the upper electrode sheet 564 to the left is driven at a voltage equal to $V_a$ in the second segment 572.

The entire middle electrode sheet 566 is driven at a voltage equal to $V_b$. The lower electrode sheet 560, being a rotated second electrode sheet 520, is reversed right to left in the view in FIGS. 13A, 13B, and 13C from the orientation of the upper electrode sheet 564. The lower electrode sheet 568 is driven opposite the upper electrode sheet 564. Thus the lower electrode sheet 568 has its second electrode section 524 to the right 531 driven at a voltage equal to $V_a$. The first electrode section 522 of the lower electrode sheet 568 is to the left and is driven at a voltage equal to $V_c$.

In FIG. 13A, $V_{ab}$ equals $V_{bc}$, thus there is no deflection of the compound actuator 505. The right end 562 of the compound actuator 505 is thus co-planar with the left end 560 of the compound actuator 505, and there is no deflection.

FIG. 13B shows the compound actuator 505 of FIG. 13A when $V_{ab}$ is greater than $V_{bc}$. As a result, the right end 562 of the compound actuator 505 deflects upward along the z-axis 323 a deflection amount 518. In this example, the deflection amount is denoted as a positive $+\Delta$.

Deflection of the compound actuator 505 upward is caused by the first segment 570 forming a downward curve or a curve with a decreasing radius towards the second electrostrictive layer 516. At the same time, the second segment 572 attached at its left end 560 to the support 504, curves upward. That is, the second segment 572 curves with a decreasing radius towards the first electrostrictive layer 512.

FIG. 13C is the converse of the FIG. 13B when $V_{ab}$ is less than $V_{bc}$. In this configuration, the first segment 570 curves upward or with a decreasing radius toward the first electrostrictive layer 112. At the same time, the second segment 572, curves downward or with a decreasing radius toward the second electrostrictive layer 516. The result is a deflection of the right end 562 downward in a deflection amount 518 (in this instance denoted as a negative $-\Delta$). In the deflection of the compound actuator 505 shown in FIG. 13C, the right end 562 remains substantially parallel to the left end 560 even as it deflects. It will be appreciated that the right end 562 remains substantially parallel or co-planar to the left end 560 because the two oppositely curving segments 570 and 572 are of equalized length and curve in an equalized amount, thereby forming a symmetrical s-curve.

FIGS. 13A, 13B, and 13C thus show the operation of a basic compound actuator 505. It will be appreciated that the compound actuator may have any suitable numbers of oppositely curving or driven actuator segments, depending upon the application and the desired shape of the deflection desired for the application.

A compound actuator may also be described symbolically, showing the electrode sections and electrostrictive layer segments. FIG. 14A is a symbolic representation of the electrode sheets and the electrostrictive layers of the compound actuator 505 of FIGS. 13A, 13B, and 13C. In FIG. 14A, the compound actuator 505 is again shown in cross-section in the x-z plane with the x-axis 521 running right to left, and the z-axis 523 running up to down. The compound actuator has, a first segment 570 to the right and a second segment 572 to the left. The length 185 of the first segment 570 approximately equals the length 185 of the second segment 572. The right end 562 of the compound actuator 505 is to the right, and the left end 560 is to the left. The top electrode sheet 564 is the upper most layer in the FIG. 14A, and the bottom electrode sheet 568 is the lowermost layer. Both the upper electrode sheet 564 and the lower electrode sheet 568 include the same configuration of a second electrode sheet 520, but are rotated with respect to each other (not shown).

The second electrode sheet 520, utilized for both the upper electrode sheet 564 and the lower electrode sheet 568, has a first end 506 and a second end 508. The second electrode sheet 520 includes a center gap 529 separating the first electrode section 522 and the second electrode section 524. The first electrode section 522 has a length 185 equalized to the length of the second electrode section 524 equalized to the lengths of the two segments 570 and 572 of the compound actuator 505. By way of example and not limitation, the second electrode sheet 520 is in a configuration of an intermediate electrode sheet 520 as shown in FIG. 14B, described below. The electrode sections control the electrical field experienced by the adjacent electrostrictive layers and thus form different driven segments of the compound actuator 505. In this exemplary embodiment, the first end 506 of the second electrode sheet 520 forming the upper electrode sheet 564 is to the right, and the second end 508 of the second electrode sheet 520 forming the upper electrode sheet 564 is to the left. The first electrode section 522 runs from the first end 506 to the gap 529 at the center 507. The second electrode section 524 runs from the gap 527 at the center 507 to the second end 508. In this configuration, the first electrode section 522 of the upper electrode sheet 564 is to the right while the second electrode section 524 is to the left.

As in FIGS. 13A, 13B, and 13C, the compound actuator 505 in this exemplary embodiment includes a five layer sandwich of the upper electrode sheet 524, a first electrostrictive layer 512, a middle electrode sheet 566, a second electrode sheet 516, and a lower electrode sheet 568, from the upper side to the lower side of the compound actuator 505 along the z-axis 523. Thus, immediately below the upper electrode sheet 564 is the first electrostrictive layer 512 and immediately below the first electrostrictive layer 512 is the intermediate electrode sheet 566. By way of example but not limitation, the intermediate electrode sheet 566 is in a configuration 540 of an intermediate electrode sheet as shown in FIG. 14B, described below. The entire intermediate electrode section 542 is driven at a voltage equal to $V_b$.

The first electrode section 522 of the upper electrode sheet 564 is driven at a voltage equal to $V_c$, while the second electrode section 524 of the upper electrode sheet 564 is driven at a voltage equal to $V_a$. As a result, the first electrostrictive layer 512 experiences two different electrical fields: an electrical field with the potential voltage equal to $V_{bc}$ on the right; and an electrical field with a voltage potential equal to $V_{ab}$ on the left. These fields correspond to the charges applied to the electrode sections of the upper electrode sheets 564 immediately above and the intermediate electrode sheet 566 driven at a voltage $V_b$ below. Thus the first electrostrictive layer has a right segment 584 that experiences a voltage potential equal to $V_b$, and a left segment 586 experiencing a voltage potential equal to $V_{ab}$.

Below the intermediate electrode layer 566 is the second electrostrictive layer 516. Below the second electrostrictive sheet is the lower electrode sheet 568.

In this example, the ends 508 and 506 of second electrode sheet 520 are reversed right-to-left from the upper electrode sheet 564. Thus, the first end 506 of the second electrode sheet 520 that forms the lower electrode sheet 568 is on the left end 560, while the second end 508 of the second electrode sheet 520 forming the lower electrode sheet 568 is on the right end 562. The first section 522 to the left is driven with a voltage equal to $V_c$. The second end section 524 to the right is driven with a voltage equal to $V_a$. As a re$_c$, the second electrostrictive layer 516 immediately above the lower electrode sheet 568 and immediately below the middle electrode sheet 566 is driven with an electrical field of two different electrical potentials. A right hand segment 586 is driven at a voltage potential equal to $V_{ab}$, and a left hand segment 588 is driven at a voltage potential equal to $V_{bc}$. In this configuration, as shown in FIGS. 13A, 13B, and 13C, as voltage $V_{ab}$ and $V_b$, vary inversely to each other, the first segment 570 and the second segment 572 of the compound actuator 505 curve in opposite directions.

It will be appreciated that a compound actuator may be driven with a wide range of electrical configurations and layouts of connections. However, it will be appreciated that certain configurations and layouts may be more easily manufactured and assembled than other configurations and layouts. FIG. 14B shows an exemplary configuration for the compound actuator 505 of FIGS. 13A, 13B, 13C and 14A. FIG. 14B presents a top view of two electrode sheets that can be utilized to construct a compound actuator. In FIG. 14B the x-axis 521 runs from right to left. The x-axis 521 forms the centerline between the first end 506 and the second end 508 of the two electrode sheets, the intermediate electrode sheet 540, and the second electrode sheet 520. The x-y plane is shown with the y-axis 525 running up and down. These axes correspond to the isometric views of the electrodes in FIG. 11. It will be appreciated that the intermediate electrode sheet 540 and the second electrode sheet 520 are similar to end halves of the intermediate electrode sheet 140 and the second electrode sheet 120 of FIG. 8B.

In FIG. 14B, the intermediate electrode sheet 540 has a first end 506, a second end 508, and an electrode area 542 between the ends 506 and 508. Each end 506 and 508 has a connection tab 551 and 553, respectively, each with a connection point 545. The connection tabs 551 and 553 and the connection points 545 are situated on the centerline or x-axis 521 of the intermediate electrode sheet 540. The connection points 545 to the intermediate electrode sheet 540 are driven at a voltage equal to $V_b$ and are located at the centerline or x-axis 521 of the intermediate electrode sheet 540. Connections to $V_a$ and $V_b$ can be made to electrode sheets above and below the intermediate electrode sheet 540 on alternate sides of the centerline and thus not overlap or short out with each other, or with the connection points 545.

The second electrode sheet 520 has a first end 506 and a second end 508, with a first electrode section 522, a second electrode section 524, and a center gap 529 intermediate sections 522 and 524. The center gap 529 at the center 507 between the two ends 506 and 508 permits the first electrode section 522 to be driven at a voltage different from the second electrode section 524. In this embodiment, the first electrode section 522 at end 506 has a connection tab 541 and a connection point 547. In this orientation, the electrode sheet 520 has its first end 506 and its first electrode section 522 to the right forming a right end 562 with a connection tab 541 and a connection point 547. The connection tab 541 and the connection point 547 are located at the first end 506 down in the y-axis direction 525 in this top view from the x-axis 521 or centerline of the second electrode sheet 520, and form the right end 560. The connection tab 541 and the connection tab 547 are a suitable distance from the centerline or x-axis 521 so as to not overlap with the connection tab 551 and connection point 545 of the first end 506 of the intermediate electrode layer when a compound actuator (not shown) is assembled.

The second electrode sheet 520 in this orientation has a connection tab 543 and a connection point 549 on its second end 508 that forms the left end 560. The connection tab 543 and the connection point 549 are up in the y-axis direction 525 in this top view away from the centerline or x-axis 521 of the second electrode sheet 520. A suitable distance is chosen so that the connection tab 543 and the connection point 549 do not overlap with the connection tab 553 and connection point 545 on the second end 508 of the intermediate electrode sheet 540 (which has its connection tab 553 and connection point 545 on the centerline or x-axis 521).

FIG. 14B thus shows exemplary electrode sheet configurations that are suitably utilized to assemble the compound actuator 505 of FIGS. 13A, 13B, 13C, and 14A. In FIGS. 13A, 13B, 13C and 14A, the upper electrode sheet 564 is a second electrode sheet 520 in the orientation shown in FIG. 14B. The middle electrode sheet 566 of FIGS. 13A, 13B, 13C, and 14A is the same shape as the intermediate electrode sheet 540 of FIG. 14B. The lower electrode sheet 568 in FIGS. 13A, 13B, 13C, and 14A is the same shape as the second electrode sheet 520 of FIG. 14B, but is reoriented by rotating the electrode sheet 180 degrees around its x-axis or centerline 521. In this lower electrode sheet 568 configuration (not shown), the rotation places connection tab 541 and connection 547 up in the y-axis 525 direction in top view from the centerline and x-axis 521 on the right end 562, and places the left end connection tab 543 and connection 549 down in the y-axis direction in top view from the centerline or x-axis of the second electrode sheet 520. This permits the right end electrode section of the lower electrode sheet 568 to be driven at a voltage of $V_a$, while the left electrode section of the lower electrode sheet 568 in FIGS. 13 and 14 is driven at a voltage equal to $V_c$. Thus, the compound actuator 505 of FIGS. 13 and 14 can be assembled by manufacturing two second electrode sheets 520 and one intermediate electrode sheet 540 and assembling them in these orientations with respect to each other.

It will be appreciated that compound actuators 505 such as that in FIGS. 13 and 14 with electrical configurations as described in FIGS. 14B may be placed end-to-end, thereby forming a compound actuator of any desired length. Further, the compound actuator can be constructed as a multi-layer actuator in the fashion described in connection with FIGS. 10 and 11. Compound actuators, whether with two segments such as an s-curve actuator or with more segments, may also be combined into arrays utilizing multiple compound actuators to drive mechanical equipment or other devices.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A system for a recurve actuator, the system comprising:
   a first electrode layer including a first electrode section, a second electrode section, and a third electrode section, the second electrode section being intermediate the first and third electrode sections;
   a second electrode layer including a fourth electrode section, the fourth electrode section being arranged to overlap the first, second, and third electrode sections;
   a first electrostrictive material configured to change length in response to an applied electrical field, the first electrostrictive material being positioned between the first electrode layer and the second electrode layer, the first electrostrictive material having a first length adjoining the first electrode section, a second length adjoining the second electrode section, and a third length adjoining the third electrode section;
   a third electrode layer including a fifth electrode section, a sixth electrode section, and a seventh electrode section, the sixth electrode section being intermediate the fifth and seventh electrode sections, the fifth, sixth, and seventh electrode sections being arranged to overlap the first, second, and third electrode sections, respectively; and
   a second electrostrictive material configured to change length in response to an applied electrical field, the second electrostrictive material being positioned between the second electrode layer and the third electrode layer, the second electrostrictive material having a fourth length adjoining the fifth electrode section, a fifth length adjoining the sixth electrode section, and a sixth length adjoining the seventh electrode section, the second electrostrictive material and the first electrostrictive material being attached to each other such that at least one differential change in the first length and the fourth length, the second length and the fifth length, and the third length and the sixth length, results in a lateral motion of the first electrostrictive material and the second electrostrictive material.

2. The system of claim 1, wherein the first electrostrictive material and the second electrostrictive material each include at least one sheet of electrostrictive material.

3. The system of claim 1, wherein the first electrode layer, the second electrode layer, and the third electrode layer each include at least one sheet of conductive material.

4. The system of claim 1, further comprising:
a first voltage source arranged to provide a voltage differential between the first electrode section and the fourth electrode section, the second electrode section and the fifth electrode section, and the third electrode section and the sixth electrode section, the voltage differential causing the first electrostrictive material and the second electrostrictive material to change from the first length, the second length, the third length, the fourth length, the fifth length, and the sixth length to a seventh length, an eighth length, a ninth length, a tenth length, an eleventh length, and a twelve length, respectively, that are shorter than the first length, the second length, the third length, the fourth length, the fifth length, and the sixth length, respectively.

5. The system of claim 4, further comprising:
a second voltage source arranged to provide a variable voltage to the second electrode layer, the variable voltage causing the first electrostrictive material to change from the seventh length towards a thirteenth length that is shorter than the seventh length, the eighth length towards a fourteenth length that is longer than the eighth length, and the ninth length towards a fifteenth length that is shorter than the ninth length when the second electrostrictive material changes from the tenth length towards a sixteenth length that is longer than the tenth length, the eleventh length towards a seventeenth length that is shorter than the eleventh length, and the twelfth length towards an eighteenth length that is longer than the twelfth length, the variable voltage further causing the first electrostrictive material to change from the seventh length towards a nineteenth length that is longer than the seventh length, the eighth length towards a twentieth length that is shorter than the eighth length, and the ninth length towards a twenty-first length that is longer than the ninth length when the second electrostrictive material changes from the tenth length towards a twenty-second length that is shorter than the tenth length, the eleventh length towards a twenty-third length that is longer than the eleventh length, and the twelfth length towards a twenty-fourth length that is shorter than the twelfth length.

6. The system of claim 5, wherein the second voltage source includes a biased AC voltage source, such that the lateral motion is periodic.

7. The system of claim 6, wherein the lateral motion is resonant.

8. The system of claim 1, wherein the first electrode section includes a first connection tab, the second electrode section includes a first connection point, the third electrode section includes a second connection tab, the fourth electrode section includes a third connection tab, the fifth electrode section includes a fourth connection tab, the sixth electrode section includes a second connection point, and the seventh electrode section includes a fifth electrode tab, the first, third, and fourth connection tabs being arranged to not overlap each other, the first and second connection points being arranged to not overlap each other, and the second, third, and fifth connection tabs being arranged to not overlap each other.

9. The system of claim 1, wherein the second electrode layer further includes an eighth electrode section, the first electrode section includes a first connection tab, the second electrode section includes a first connection point, the third electrode section includes a second connection tab, the fourth electrode section includes a third connection tab, the fifth electrode section includes a fourth connection tab, the sixth electrode section includes a second connection point, the seventh electrode section includes a fifth electrode tab, and the eighth electrode section includes a sixth electrode tab, the first, third, and fourth connection tabs being arranged to not overlap each other, the first and second connection points and the fourth and eighth electrode sections being arranged to not overlap each other, and the second, sixth, and fifth connection tabs being arranged to not overlap each other.

10. The system of claim 9, wherein the third connection tab is located intermediate the first connection tab and the fourth connection tab, and the sixth connection tab is located intermediate the second connection tab and the fifth connection tab.

11. The system of claim 1, wherein the first electrostrictive material and the second electrostrictive material include one of grafted elastomers, ionic polymers, ceramics, relaxor ferroelectric-ferroelectric solid state solutions, lead zinc niobate-lead titanate, and electron irradiated copolymer polyvinylidene fluoride-trifluoroethyline.

12. The system of claim 1, wherein the relaxor ferroelectric-ferroelectric solid-state solutions include one of lead magnesium, PZN-PT electrostrictive crystals, PMN-PT electrostrictive crystals, and complex perovskite crystal analogs.

13. The system of claim 1, wherein the first electrostrictive material and the second electrostrictive material are attached to each other with an attachment including adhesive.

14. The system of claim 13, wherein the adhesive includes at least one sheet of adhesive film.

15. The system of claim 1, wherein the first electrode section has a first electrode length, the second electrode section has a second electrode length, the third electrode section has a third electrode length, the fourth electrode section has a fourth electrode length, the fifth electrode section has a fifth electrode length, the sixth electrode section has a sixth electrode length, and the seventh electrode section has a seventh electrode length, the third, fifth and seventh electrode lengths are equalized toward the first electrode length, the fourth electrode length is around four times the first electrode length, and the second and sixth electrode lengths are around two times the first electrode length.

16. The system of claim 15 wherein of the lateral motion includes a recurve.

* * * * *